US011853880B2

(12) United States Patent
Horng et al.

(10) Patent No.: US 11,853,880 B2
(45) Date of Patent: Dec. 26, 2023

(54) SRAM ARCHITECTURE FOR CONVOLUTIONAL NEURAL NETWORK APPLICATION

(71) Applicant: Taiwan Semiconductor Manufacturing Company Limited, Hsinchu (TW)

(72) Inventors: Jaw-Juinn Horng, Hsinchu (TW); Szu-Chun Tsao, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 687 days.

(21) Appl. No.: 17/001,947

(22) Filed: Aug. 25, 2020

(65) Prior Publication Data

US 2022/0067501 A1 Mar. 3, 2022

(51) Int. Cl.
*G11C 11/54* (2006.01)
*G06N 3/08* (2023.01)
*G06N 3/04* (2023.01)
*G11C 11/412* (2006.01)

(52) U.S. Cl.
CPC .............. *G06N 3/08* (2013.01); *G06N 3/04* (2013.01); *G11C 11/412* (2013.01); *G11C 11/54* (2013.01)

(58) Field of Classification Search
CPC .................................................... G11C 11/412
See application file for complete search history.

(56) References Cited

U.S. PATENT DOCUMENTS

| | | | |
|---|---|---|---|
| 11,645,503 B2 * | 5/2023 | Gupta | G06N 3/063 706/41 |
| 2021/0241820 A1 * | 8/2021 | Biswas | G06N 3/045 |
| 2021/0374546 A1 * | 12/2021 | Tsai | G11C 7/1006 |
| 2022/0366968 A1 * | 11/2022 | Liu | G11C 11/54 |

* cited by examiner

*Primary Examiner* — Min Huang
(74) *Attorney, Agent, or Firm* — FOLEY & LARDNER LLP

(57) ABSTRACT

One aspect of this description relates to a convolutional neural network (CNN). The CNN includes a memory cell array including a plurality of memory cells. Each memory cell includes at least one first capacitive element of a plurality of first capacitive elements. Each memory cell is configured to multiply a weight bit and an input bit to generate a product. The at least one first capacitive element is enabled when the product satisfies a predetermined threshold. The CNN includes a reference cell array including a plurality of second capacitive elements. The CNN includes a memory controller configured to compare a first signal associated with the plurality of first capacitive elements with a second signal associated with at least one second capacitive element of the plurality of second capacitive elements, and, based on the comparison, determine whether the at least one first capacitive element is enabled.

20 Claims, 14 Drawing Sheets

SRAM ARCHITECTURE FOR CONVOLUTIONAL NEURAL NETWORK APPLICATION

BACKGROUND

Neural networks can be used in artificial-intelligence-based approaches to machine learning that may be applied, for example, in speech recognition, image recognition/object detection, and other areas. Convolutional neural networks are a class of neural networks that typically involve three stages of computation-convolutional layer(s), fully connected layer(s), and classifier(s).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
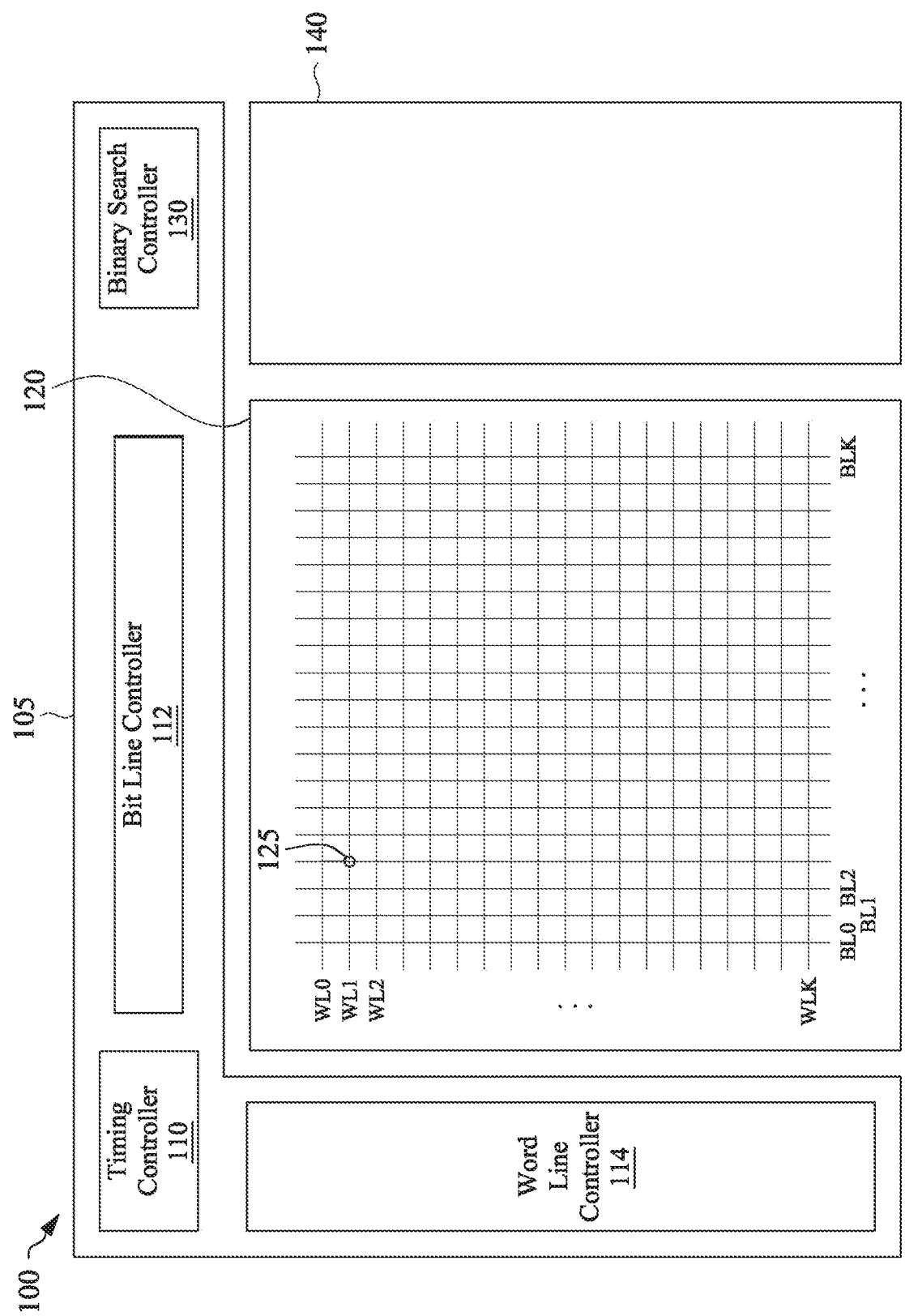
FIG. 1 is an example block diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A convolutional neural networks (CNNs) computes weights to perform a computation on new data (e.g., an input data word). A CNN can be implemented in static random access memory (SRAM). Two conventional types of SRAM-based CNNs are current-based CNNs and charge-sharing-based CNNs. However, each of the conventional types suffers from high complexity, large area, and mismatch and noise issues.

Disclosed herein are embodiments of an SRAM-based CNN based on performing a binary search. In some embodiments, the binary-search-based CNN searches for a digital word. During each iteration of the search, the CNN compares analog signals (e.g., analog voltages) and converts the analog signals to output digital bits. The analog signals are generated by charging capacitors with a current over a predetermined time. The output digital bits that can be stored in a corresponding plurality of registers. In some embodiments, in each iteration of the binary search, the binary-search-based CNN compares a first analog signal of a memory cell array to a second analog signal of a reference cell area and maps an output of the comparison to a corresponding output digital bit. In some embodiments, the first and second analog signals can be generated by charging the plurality of analog devices or sourcing current using the plurality of analog devices. Complexity is reduced because less bias circuitry is required than in the conventional CNNs. As the capacitors are charged more, the analog signals increase relative to noise, which can cause an incorrect analog-to-digital conversion. Thus, increasing the analog signal reduces the impact of noise. The size of transistors and/or capacitors in the SRAM circuitry of the binary-search-based CNN can be reduced as compared to conventional CNNs. For example, the transistors in the SRAM circuitry of the binary-search-based CNN are smaller than in the conventional current-based CNN because transistors in the SRAM circuitry of the binary-search-based CNN are used for switching and mismatches in the transistor properties (e.g., width, length, threshold voltage) does not degrade performance of the binary-search-based CNN, whereas the transistors in the conventional current-based CNN are used for current mirrors, and a corresponding mismatch in the transistor properties cause a difference in the current being supplied across circuitries of various memory cells, which will impact the accuracy of the output of the conventional current-based CNN. Moreover, capacitors of the SRAM circuitry of the binary-search-based CNN are smaller than the capacitors of the conventional charge-based CNN because of thermal noise constraints. Specifically, the analog signal compared by the binary-search-based CNN is inversely proportional to the size of the capacitor so that the thermal (e.g., kT/C) noise decreases with increasing size, whereas the analog signal at the output of the conventional charge-based CNN is proportional to the size of the capacitor used for multiply-accumulate (e.g., multiply-and-average) operation necessary in the conventional charge-based CNN, so that the thermal (e.g., kT/C) noise increases with increasing size.

FIG. 1 is a diagram of a memory device 100, in accordance with one embodiment. In some embodiments, the memory device 100 includes a memory controller 105 and a memory array 120. The memory array 120 may include a plurality of storage circuits or memory cells 125 arranged in two- or three-dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes word lines WL0, WL1 ... WLK, each extending in a first direction (e.g., X-direction) and bit lines (e.g., weight lines) BL0, BL1 ... BLK, each extending in a second direction (e.g., Y-direction). The word lines WL and the bit lines BL may be conductive metals or conductive rails. In one aspect, each memory cell 125 is coupled to a corresponding word line WL and a corresponding bit line, and can be operated according to voltages or currents through the corresponding word line WL and the corresponding bit line BL. In some embodiments, the memory array 120 includes additional or alternative lines (e.g., digital input lines, select lines, reference lines, reference control lines, power rails, etc.). For example, the memory array 120 may include input data lines extending in the first direction in addition to word lines. In some embodiments, each of the memory cells includes a plurality of analog devices (e.g., capacitive elements). Detailed descriptions on configurations and operations of memory device 100 are provided below with respect to FIGS. 2A through 8.

The memory controller 105 is a hardware component that controls operations of the memory array 120. In some embodiments, the memory array 120 includes a bit line controller 112, a word line controller 114, and a timing controller 110. In one configuration, the word line controller 114 is a circuit that provides a voltage or a current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. The bit line controller 112 may be coupled to bit lines BL of the memory array 120, and the word line controller 114 may be coupled to word lines WL of the memory array 120. In one example, to write data to a memory cell 125, the word line controller 114 provides a voltage or current to the memory cell 125 through a word line WL coupled to the memory cell 125, and applies a bias voltage to the memory cell 125 through a bit line BL coupled to the memory cell 125. In one example, to read data from a memory cell 125, the word line controller 114 provides a voltage or current to the memory cell 125 through a word line WL coupled to the memory cell 125, and senses a voltage or current corresponding to data stored by the memory cell 125 through a bit line coupled to the memory cell 125. In some embodiments, the word line controller 114 includes a row decoder that decodes an n-length row and activates one of the $2^n$ rows by asserting the corresponding one of the $2^n$ word lines, and the bit line controller 114 controls a multiplexer to select $2^n$ bits from the row as the data to access. In some embodiments, the memory controller 105 includes more, fewer, or different components than shown in FIG. 1.

In some embodiments, the memory controller 105 includes a binary search controller 130. In one configuration, the binary search controller 130 is a circuit that determines which analog devices in the memory array 120 are enabled. Detailed descriptions on configurations and operations of the binary search controller 130 are provided below with respect to FIGS. 2A through 8.

In some embodiments, the memory device 100 includes a reference memory array 140. The reference memory array 140 is a hardware component that is operated on by the binary search controller 130. In some embodiments, the reference memory array 140 is similar to the memory array 120. Detailed descriptions on configurations and operations of reference memory array 140 are provided below with respect to FIGS. 2A through 8.

Figure 2A:
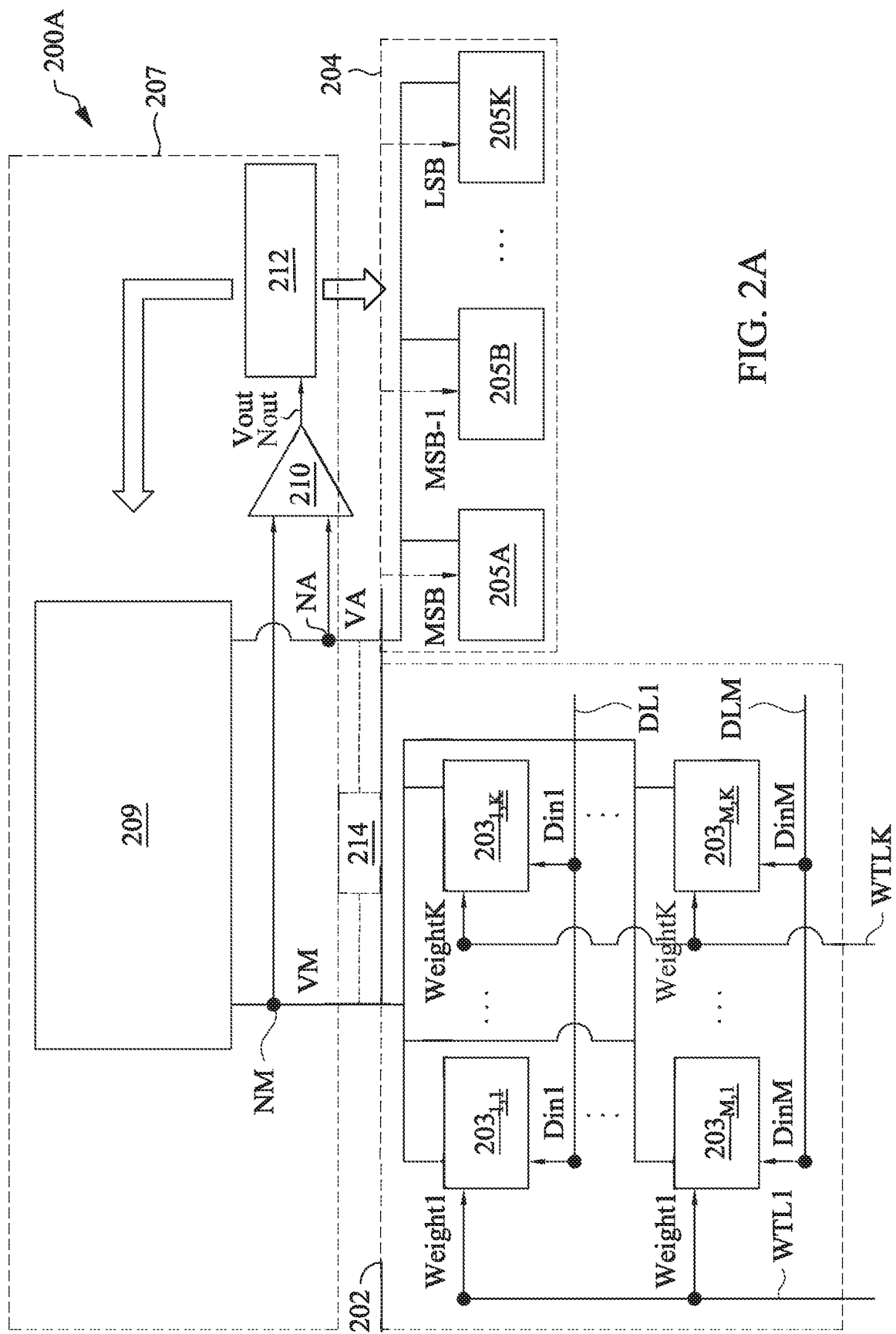
FIGS. 2A-2E are example block diagrams of a convolutional neural network (CNN), in accordance with some embodiments.

FIG. 2A is an example block diagram of a convolutional neural network (CNN) 200A, in accordance with some embodiments. The CNN 200A includes a memory cell array 202. The memory cell array 202 includes digital input (Din) lines DL1, DL2, ... DLM extending in a first direction (e.g., the X direction), defining rows, and weight lines WTL1, WTL2, ... WTLK extending in a second direction (e.g., the Y direction), defining columns. In some embodiments, the weight lines are similar to the bit lines of FIG. 1. In some embodiments, the memory cell array 202 additionally includes word lines (e.g., the word lines in FIG. 1) that extend in the first direction. Each of the Din lines DL1, DL2, ... DLM (i.e., each Din line DL) can carry one Din bit of a Din word including M Din bits (e.g., Din1, Din2, ... DinM). Each of the weight lines WTL1, WTL2, ... WTLK (i.e., each weight line WTL) can carry one weight bit of a weight word including K weight bits (e.g., weight1, weight2, ... weight K). In some embodiments, each word line is asserted so that the weight bits on the corresponding row can be accessed and/or stored.

The memory cell array 202 includes a plurality of memory cells $203_{1,1}$-$203_{M,K}$ located at the intersection of the Din lines and the weight lines. For example, $203_{1,1}$ is coupled to the corresponding Each of the plurality of memory cells $203_{1,1}$-$203_{M,K}$ (i.e., each memory cell 203) is configured to store (e.g., pre-store) one weight bit. Thus, each weight bit is stored in a subset of the memory cells 203 that shares (e.g., is coupled to) a same column. Each memory cell 203 is configured to receive one Din bit. Thus, each Din bit is asserted on a subset of the memory cells 203 that shares a same row.

In each memory cell 203, there is a circuit configured to multiply (e.g., in an element-wise manner) a weight bit stored thereon and a Din bit received thereby to, in some embodiments, generate a product. Embodiments of the circuit are described with respect to FIGS. 5A-5F. Thus, the plurality of memory cells $203_{1,1}$-$203_{M,K}$ is matrix-multiplying a Din word in column-major format with a weight word in row-major format to generate a plurality of products, in accordance with the following equation (Eqn. 1):

$$P = \begin{bmatrix} Din_1 \times Weight_1 & \cdots & Din_1 \times Weight_K \\ \vdots & \ddots & \vdots \\ Din_M \times Weight_1 & \cdots & Din_M \times Weight_K \end{bmatrix},$$

wherein each element-multiplication is performed by a different memory cell 203, and wherein P is the product.

Each memory cell 203 comprises at least one analog device (e.g., passive element, capacitive element, resistive element, or a transistor device in saturation/active mode). In some embodiments, the analog device is configured to convert the corresponding generated product, which is digital, to an analog signal. In some embodiments, when the Din bit is at a first voltage level (e.g., high voltage level, VDD, first logic state, high logic state) and the weight bit is at the first voltage level, the analog device is enabled (e.g., on, connected, has a first analog signal). In some embodiments, when the Din bit is at a second voltage level (e.g., low voltage level, GND, second logic state, low logic state) or the weight bit is at the second voltage level, the analog device is disabled (e.g., off, disconnected, has a second analog signal). In some embodiments, the analog device is a capacitive element coupled in series with a first switch and a second switch that are controlled by the Din bit and the weight bit, respectively. If each of the Din bit and the weight bit are at a first voltage (e.g., if each of the switches are enabled), the capacitive element is enabled (e.g., the capacitive element can be charged (e.g., by a current source) to hold (e.g., carry, store) a voltage). In some embodiments, a magnitude of the voltage that the capacitor can hold is proportional to a magnitude of the product of the voltage of the weight bit and the voltage of the Din bit. For example, if the Din bit and the weight bit are at a first voltage (e.g., VDD) representing a high logic state, a magnitude of the voltage stored across the capacitive element is a non-zero value, whereas if at least one of the Din bit or the weight bit are at a second voltage (e.g., 0V) representing a low logic state, a magnitude of the voltage stored across the capacitive element is zero. In some embodiments, the analog device is a transistor device in saturation coupled in series with a first switch and a second switch that are controlled by the Din bit and the weight bit, respectively. If each of the Din bit and the weight bit are at a first voltage (e.g., if each of the switches are enabled), the transistor device is enabled (e.g., the transistor device can source or sink current to/from a passive element, such as a resistive or capacitive element, in series with the transistor device and the switches). In some embodiments, a magnitude of the voltage stored across the passive element as a result of the transistor device sourcing/sinking current is proportional to a magnitude of the product of the voltage of the weight bit and the voltage of the Din bit.

In some embodiments, the number of (e.g., size of, a quantity of, a number of parallel instances of) the at least one analog device is proportional (e.g., binarily proportional, binary-weighted in accordance with) to a position of the weight bit (e.g., weight bit position) that is used to generate the product associated with the at least one analog device. For example, the memory cell $203_{1,1}$ includes N analog devices, which is proportional to a position of the first (e.g., most significant) weight bit, Weight1, stored thereon, the memory cell $203_{1,2}$ includes N/2 analog devices, which is proportional to a position of the next weight bit, Weight, stored thereon, and so on, until the memory cell $203_{1,K}$ includes 1 analog device, which is proportional to a position of the last (e.g., least significant) weight bit, WeightK, stored thereon, wherein $2^K=N$. In another example, if there is a 7-bit resolution, the number of analog devices are 64, 32, 16, 8, 4, 2, and 1, for the respective memory cells.

In some embodiments, the at least one first analog device is enabled (e.g., activated, coupled to a node voltage having an impedance less than a predetermined impedance) when the corresponding Din bit and corresponding weight bit both satisfy a predetermined threshold. In some embodiments, satisfying the predetermined threshold includes that the corresponding Din bit and corresponding weight bit are both greater than half of the supply voltage. In some embodiments, satisfying the predetermined threshold includes that both of the corresponding Din bit and corresponding weight bit are a high logic state (e.g., "1", on, high voltage, supply voltage, VDD). In some embodiments, the at least one first analog device is disabled (e.g., deactivated, floating, coupled to a node voltage having an impedance greater than a predetermined impedance) when either of the corresponding Din bit and corresponding weight bit satisfies a second predetermined threshold. In some embodiments, satisfying the second predetermined threshold includes that either the corresponding Din bit and corresponding weight bit is less than half of the supply voltage. In some embodiments, satisfying the second predetermined threshold includes that either the corresponding Din bit and corresponding weight bit is a low logic state (e.g., "0", off, low voltage, ground voltage, GND, 0V).

In some embodiments, the at least one first analog device is enabled when the generated product satisfies a predetermined threshold. In some embodiments, satisfying the predetermined threshold includes that the product is a high logic state (e.g., VDD), which corresponds to an AND operation of the Din bit and the weight bit. In some embodiments, satisfying the predetermined threshold includes that a voltage of each of the Din bit and the weight bit is greater than a reference voltage (e.g., VDD/2). In some embodiments, satisfying the predetermined threshold includes that the product is a low logic state (e.g., GND), which corresponds to a NAND operation of the Din bit and the weight bit. In some embodiments, satisfying the predetermined threshold includes that a voltage of at least one of the Din bit or the weight bit is less than a reference voltage (e.g., VDD/2).

The CNN 200A includes a reference cell array 204. The reference cell array 204 includes a plurality of reference cells 205A-205K. In some embodiments, the reference cells 205A-K are similar to the memory cells $203_{1,1}$-$203_{M,K}$ except that instead of receiving weight bits and Din bits, each of the reference cells 205A-K (i.e., each reference cell 205) receives a reference bit of a reference word including the reference bits MSB, MSB-1, . . . , LSB. Each reference cell 205 includes a second at least one analog device. In some embodiments, the number of (e.g., size of) the at least one analog device is proportional (e.g., binarily proportional, binary-weighted in accordance with) to a position of a reference bit (e.g., reference bit position) that is used to enable the at least one analog device. For example, the reference cell 205A includes N analog devices, which is proportional to a position of the first (e.g., most significant) reference bit, MSB, received from the binary search controller 212, the reference cell 205B includes N/2 analog devices, which is proportional to a position of the next reference bit, MSB-1, received from the binary search controller 212, and so on, until the reference cell 205K includes 1 analog device, which is proportional to a position of the last (e.g., least significant) reference bit, LSB, received from the binary search controller 212, wherein $2^K=N$. In another example, if there is a 7-bit resolution, the number of analog devices are 64, 32, 16, 8, 4, 2, and 1, for the respective memory cells.

In some embodiments, the second at least one analog device is enabled when the corresponding reference bit satisfies a third predetermined threshold. In some embodiments, satisfying the third predetermined threshold includes that the reference bit is greater than half of the supply voltage. In some embodiments, satisfying the predetermined threshold includes that the reference bit is a high logic state. In some embodiments, the reference cell 205 receives a second, fixed signal (e.g., VDD, AVDD, a supply signal).

The CNN 200A includes a memory controller 207. In some embodiments, the memory controller 207 is configured to convert one or more analog signals of a plurality of analog devices to a respective one or more digital bits that can be stored in one or more respective registers. The memory controller 207 includes charging circuitry 209. In some embodiments, the charging circuitry 209 includes current sources (CSs) (see FIG. 2B) or passive (e.g., passive or resistive) elements (see FIGS. 2C-2E). When enabled, a first portion of the charging circuitry 209 charges the enabled subset (e.g., portion) of the first analog devices (e.g., capacitive elements) of the memory cell array 202. When enabled, a second portion of the charging circuitry 209 charges the enabled subset of the second analog devices (e.g., capacitive elements) of the reference cell array 204. When enabled, a third portion of the charging circuitry 209 charges the enabled subset of the first analog devices. When enabled, a first portion of the charging circuitry 209 charges the enabled subset of the second analog devices.

The memory controller 207 includes a comparator 210. The comparator 210 compares a first signal (e.g., voltage) VM at a first node (e.g., first sensing node) NM corresponding to the first analog devices with a second signal (e.g., voltage) VA at a second node (e.g., second sensing node) NA associated with the plurality of second capacitive elements and generates an output (e.g., a digital output) signal (e.g., voltage) Vout at node Nout based on the comparison. In some embodiments, if a difference of VA and VM is a first polarity (e.g., if VA is greater than VM), Vout is a high logic state, and if a difference of VA and VM is a second polarity (e.g., if VA is less than VM), the Vout is a low logic state. In some embodiments, the comparator 210 is a hardware component. In some embodiments, the comparator includes an operational amplifier, wherein the gain of the operational amplifier will cause any difference in the voltages of the inputs VM and VA greater than a predetermined threshold (e.g., 1 nV) to generate a high or low logic state as Vout. The operational amplifier can be implemented as a differential, two-stage amplifier or other operational amplifier implementations known to those of skill in the art of hardware circuit design.

The memory controller 207 includes a binary search controller 212. The binary search controller 212 is configured to determine, in an iterative manner, the number of first analog devices of the memory cell array 202 that are enabled and to store the number in one or more registers. The binary search controller 212 is configured to set (e.g., select, update) each of the plurality of reference bits to either a high logic state or a low logic state. The binary search controller 212 is configured to select portions of the charging circuitry 209. The binary search controller 212 is configured to receive Vout from the comparator. The binary search controller 212 is configured to set each of the plurality of reference bits to either a high logic state or a low logic states based on Vout. The binary search controller 212 is configured to perform an iteration of the binary search on MSB, then MSB−1, and so on, until it performs an iteration on LSB. In some embodiments, the binary search controller 212 includes at least one of the comparator 210 and the charging circuitry 209.

Figure 2B:
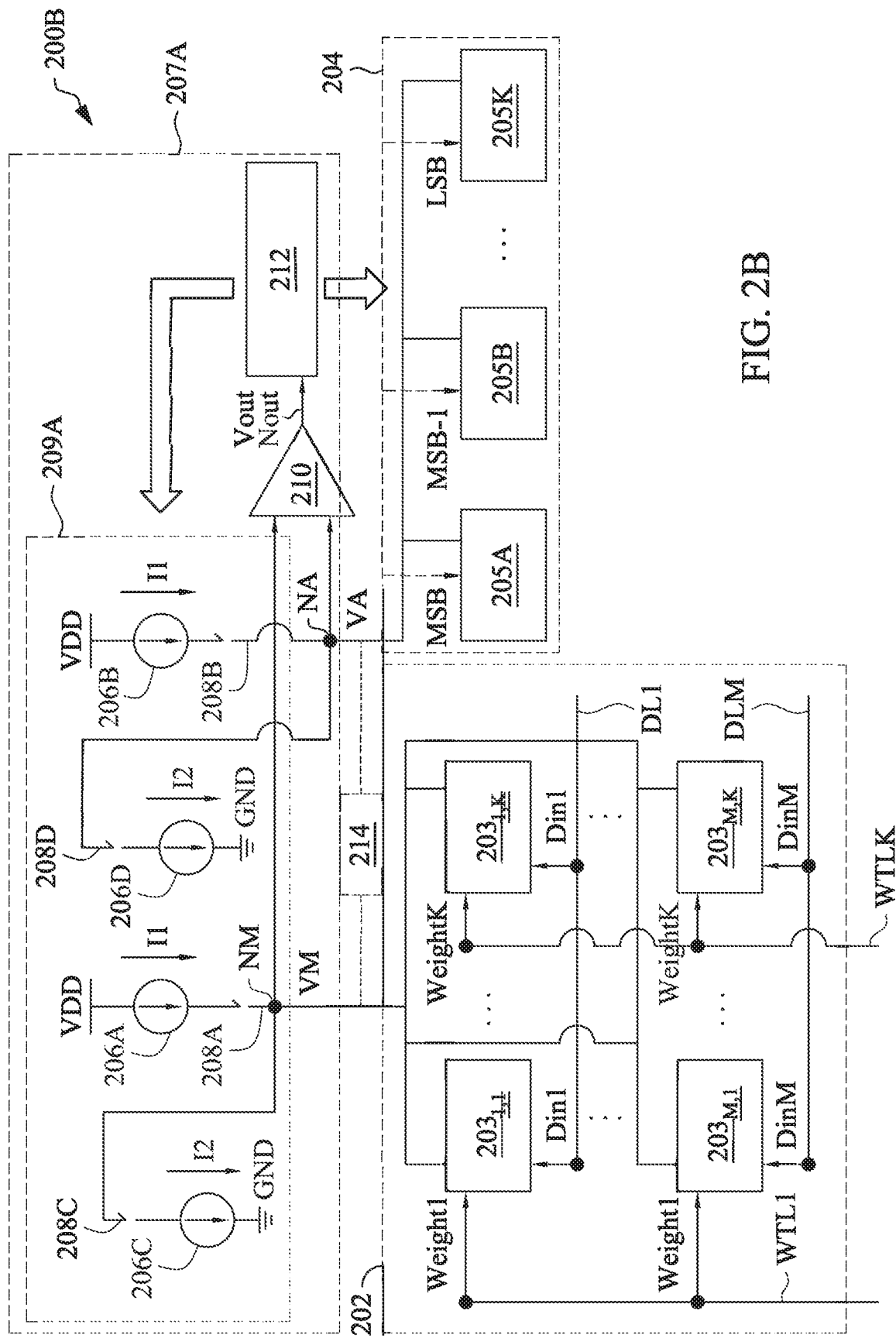
Figure 2C:
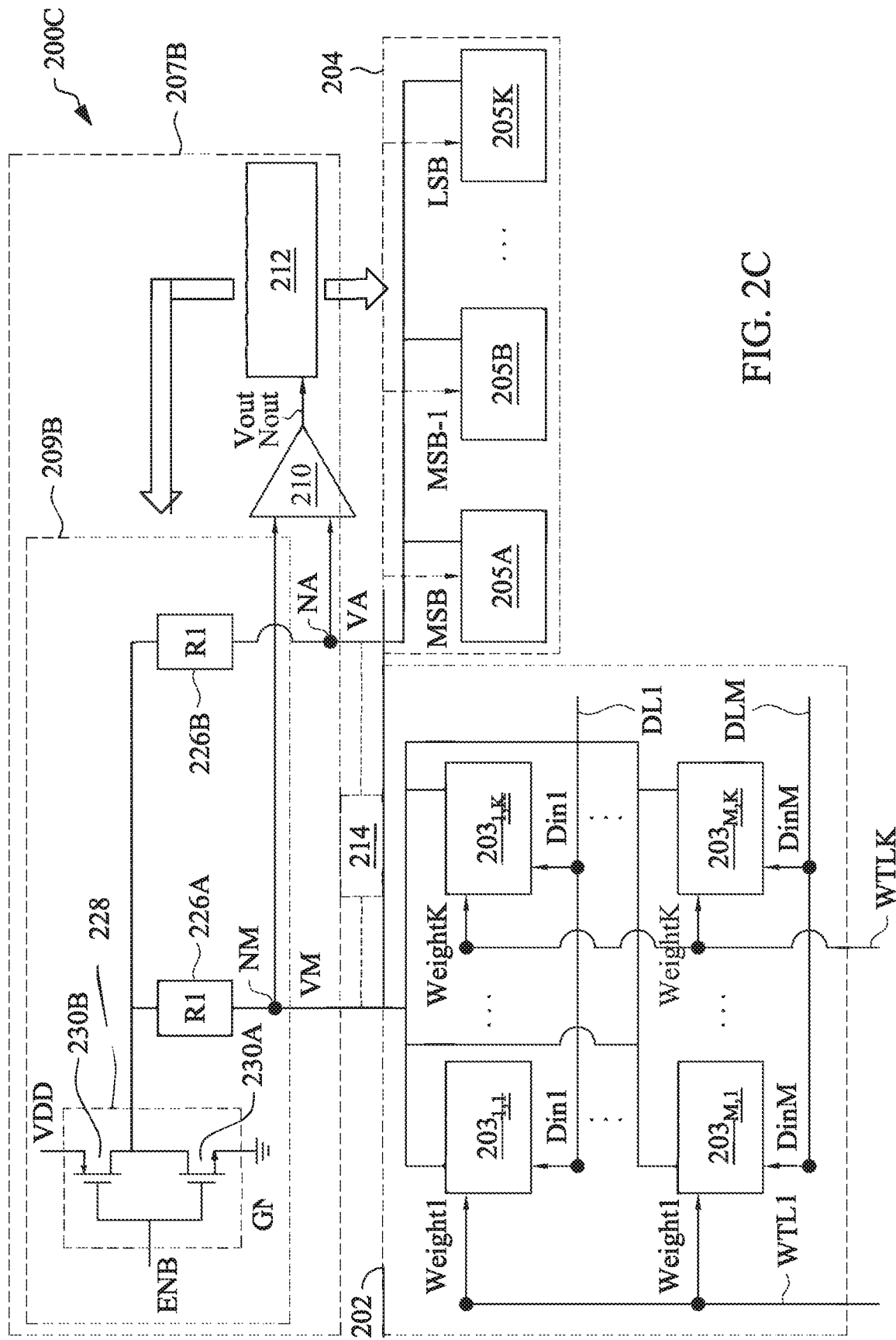
Figure 2D:
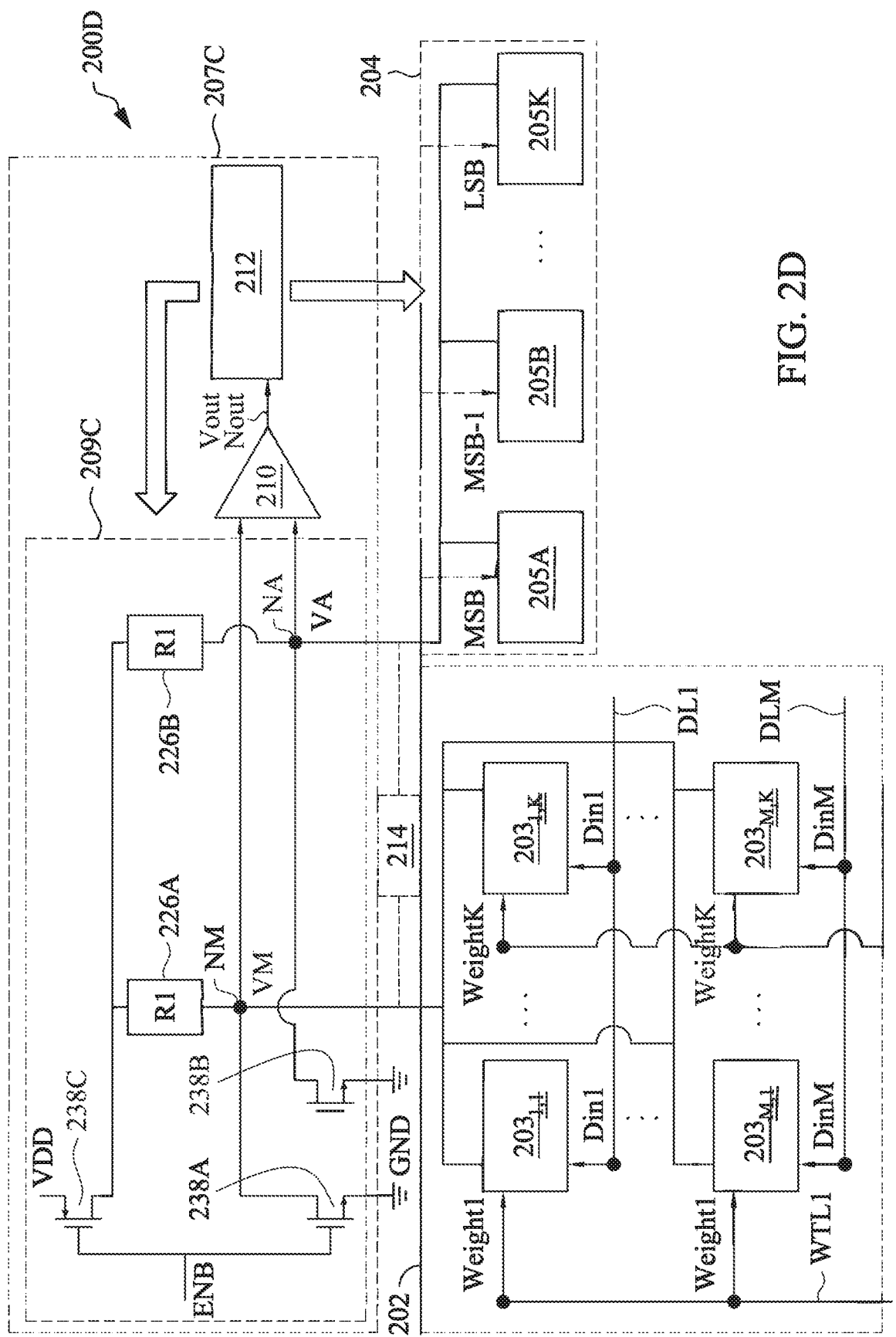
Figure 2E:
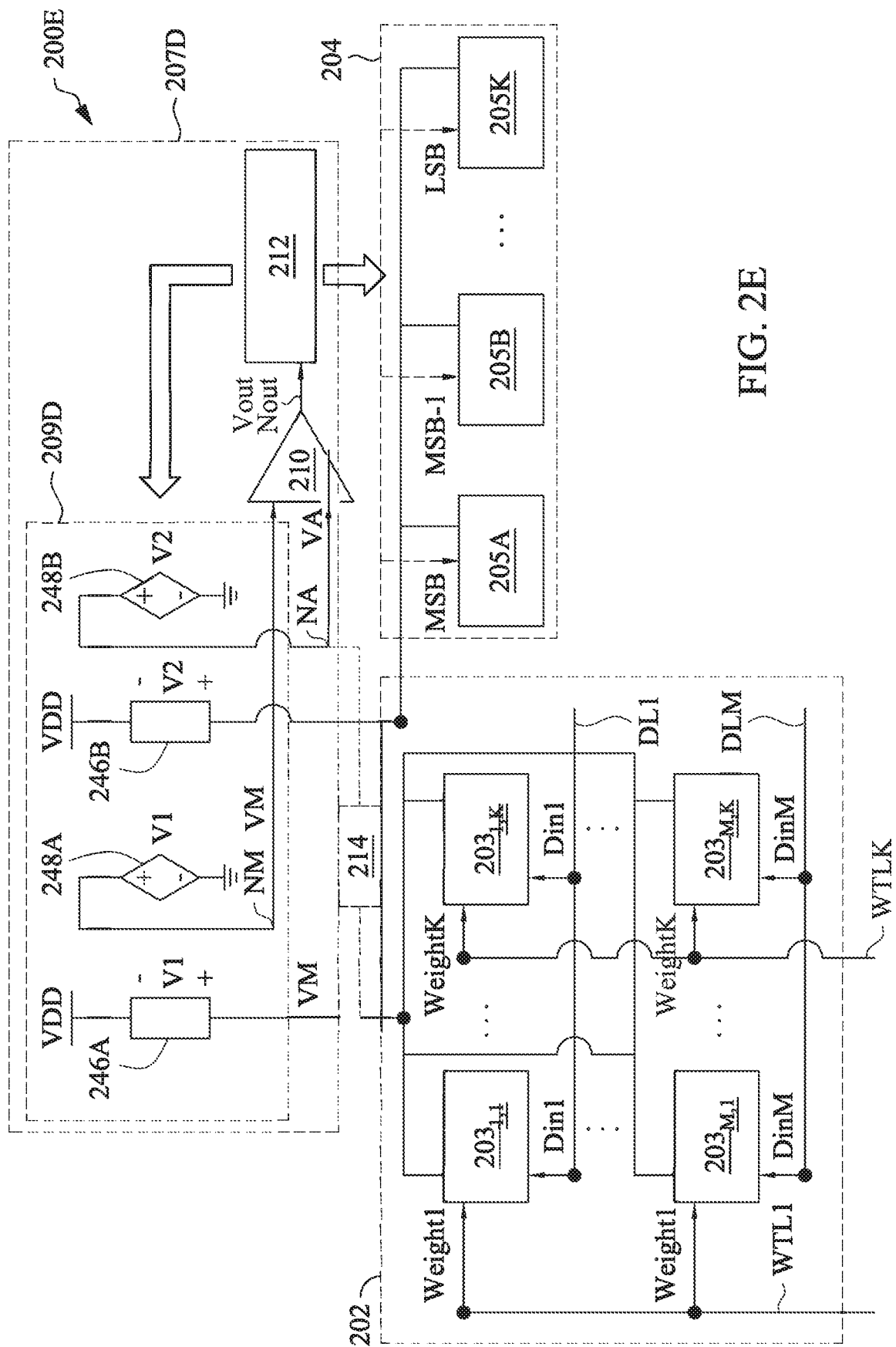
Figure 3:
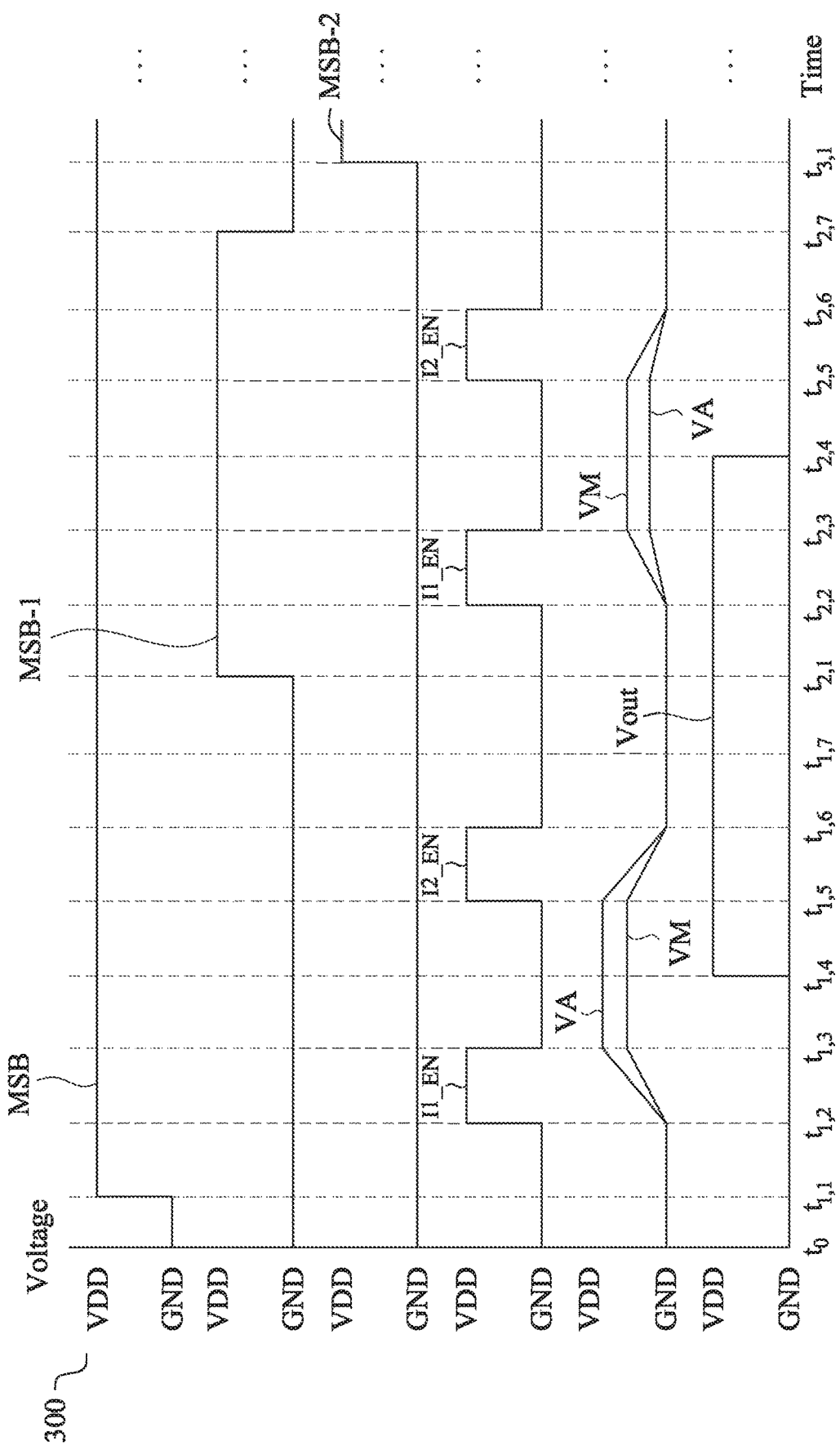
FIG. 3 is an example timing diagram of an operation of the memory controller, in accordance with some embodiments.

FIG. 3 illustrates an example timing diagram of an operation 300 of the memory controller 207, in accordance with some embodiments. Before $t_{1,1}$, a subset of analog devices (e.g., first analog devices, first capacitive elements) of the memory cell array 202 are enabled based on the weight word stored by the memory cell array 202 and the Din word received by the memory cell array 202, as described in FIGS. 2A-2E and FIGS. 5A-5F. Before $t_{1,1}$, all of the analog devices (e.g., reference/second analog devices, reference/second capacitive elements) of the reference cell 204 array are disabled (e.g., by default). For the remainder of the example with respect to FIG. 3, the analog devices are referred to as capacitive elements.

The first iteration of the operation 300 includes events at $t_{1,1}$-$t_{1,7}$. During the first iteration, the memory controller determines (e.g., finds) MSB, which indicates a subset of enabled capacitive elements in the first column of the memory cell array 202. At $t_{1,1}$, the memory controller 207 sets MSB of the plurality of reference bits to a high voltage (e.g., VDD, VDD1). Setting the MSB to a high voltage the at least one capacitive element of 205A to be enabled. In some embodiments, MSB (e.g., a voltage of MSB) is stored in a register. At $t_{1,2}$, the memory controller 207 sets a first enable bit (I1_EN) to a high voltage (e.g., VDD, VDD2, wherein VDD2 is same or different as/from VDD1) (e.g., set a first enable_bar bit to low voltage (GND), etc.). The I1_EN bit, when set to a high voltage, enables first and second portions of the charging circuitry 209. In response to enabling the first portion of the charging circuitry 209, the first portion transfers charge (e.g., causes current to flow) to the enabled subset of the first capacitive elements (e.g., the enabled subset of the first capacitive elements accumulates charge) and causes a voltage VM to rise in accordance with the following equation (Eqn. 2):

$$VM = \frac{1}{C1} * \int I1,$$

wherein C1 is a capacitance of the enabled subset of the first capacitive elements, and I1 is a current generated by enabling the first portion of the charging circuitry 209.

In response to enabling the second portion of the charging circuitry 209, the second portion transfers charge to the enabled subset of the reference capacitive elements and causes the voltage VA to rise in accordance with the following equation (Eqn. 3):

$$VA = \frac{1}{C2} * \int I1,$$

wherein C2 is a capacitance of the enabled subset of the reference capacitive elements, and I1 is a current generated by enabling the second portion of the charging circuitry 209.

At $t_{1,3}$, the memory controller 207 sets the I1_EN bit to a low voltage (e.g., GND). The I1_EN bit, when set to a low voltage, disables first and second portions of the charging circuitry 209. In response, the enabled subset of the first capacitive elements holds its charge and the voltage VM is held (e.g., stored, stabilized, constant, constant over time, substantially constant over time, within +/−1 mV, etc.), and the enabled subset of the reference capacitive elements holds its charge and the voltage VA is held.

At $t_{1,4}$, the memory controller 207 compares VM to VA and generates (e.g., produces, determines, identifies, etc.) Vout. In some embodiments, if VA is greater than VM, it indicates that more capacitive elements are enabled in the memory cell array 202 than in the reference cell array 204, and Vout is a high voltage (e.g., VDD, VDD3, wherein VDD3 is same or different as/from VDD1 and VDD2), and if VA is less than VM, it indicates that more capacitive elements are enabled in the reference cell array 204 than in the memory cell array 202, and Vout is a low voltage (e.g., GND). In this example, because VA is greater than VM, Vout is a high voltage.

At $t_{1,5}$, the memory controller 207 sets the I2 enable bit (I2_EN) to a high voltage (e.g., VDD) (e.g., set a second enable_bar bit to low voltage (GND), etc.). The I2_EN bit, when set to a high voltage, enables third and fourth portions of the charging circuitry 209. In response to enabling the third portion of the charging circuitry 209, the third portion transfers charge from the enabled subset of the first capacitive elements to a reference plane, such as a ground plane (e.g., the enabled subset of the first capacitive elements discharges), and causes the voltage VM to fall in accordance with the following equation (Eqn. 4):

$$VM = \frac{1}{C1} * \int I2,$$

wherein I2 is a current generated by enabling the third portion of the charging circuitry 209.

When the current source 206D is coupled to the node NA the current source 206D transfers charge from the enabled subset of the reference capacitive elements to a reference plane, and causes the voltage VA to fall in accordance with the following equation (Eqn. 5):

$$VA = \frac{1}{C2} * \int I2,$$

wherein I2 is a current generated by enabling the fourth portion of the charging circuitry 209.

At $t^{1,6}$, the memory controller 207 sets the I2_EN bit to a low voltage (e.g., GND). The I2_EN bit, when set to a low voltage, disables the third and fourth portions. In response, the enabled subset of the first capacitive elements holds its remaining charge, if any, and the voltage VM is held, and the enabled subset of the reference capacitive elements holds its remaining charge, if any, and the voltage VA is held.

At $t_{1,7}$, the memory controller 207 maps (e.g., couples, passes, converts) Vout to a voltage of MSB. In some embodiments, if Vout is a high voltage (e.g., VDD, VDD3), the memory controller 207 sets MSB to a high voltage (e.g., VDD, VDD1). In some embodiments, if Vout is a low voltage (e.g., GND), the memory controller 207 sets MSB to a low voltage (e.g., GND). In this example, because Vout is a high voltage, the memory controller 207 sets MSB to a high voltage. In some embodiments, MSB is stored in a register. In some embodiments, MSB updates a register in which MSB was stored, for example, at $t_{1,1}$.

The second iteration of the operation 300 includes events at $t_{2,1}$-$t_{2,7}$. The second iteration is similar to the first iteration, except that (1) the subset of the enabled capacitive elements in the reference cell array 204 is based on the first iteration, and (2) during the second iteration, the memory controller 207 determines (e.g., finds) MSB−1, which indicates a subset of enabled capacitive elements in the second column of the memory cell array 202. In this example of the second iteration, Vout is a low voltage because VA is less VM and the memory controller 207 maps Vout to a low voltage for MSB−1. Next iterations are performed until the memory controller 207 determines all of the reference bits MSB-LSB. In some embodiments, $t_{2,1}$ and $t_{1,7}$ can be a same time (e.g., the MSB-1 bit can be set at a same time or during a same event in which MSB bit is updated based on the comparison).

In some embodiments, each of the times (e.g., $t_{1,1}$, $t_{1,2}$, etc.) and time periods/ranges (e.g., $t_{1,2}$-$t_{1,1}$, etc.) are predetermined (e.g., triggered by a predetermined clock or signal derived from the clock, rise/fall/level in such clock or signal, etc.). In some embodiments, each of the times and time periods are adjustable/reconfigurable (e.g., adjusting a clock frequency, duty cycle, using different clocks to trigger different events, etc.).

Referring back to FIG. 2A, in some embodiments, the CNN 200A includes an offset cell 214. The offset cell 214 is configured to compensate for mismatch between properties of the analog devices of the memory cell array and the reference cell array. For example, a size of a single capacitive element in the memory cell array may be greater than a size of a single capacitive element in the reference cell array. The mismatch in the analog device properties may result in a difference in the analog voltages driving the comparator 210 even though the number of capacitive elements and the magnitude of the current being supplied are the same for the memory cell 202 and the reference cell 204. The offset cell 214 includes a plurality of analog devices that are selectively enabled and selectively coupled to either of the memory cell array 202 or the reference cell array 204. In some embodiments, the memory controller 207 sets the plurality of reference bits such that a same number of analog devices are enabled in the reference cell array 204. The memory controller 207 compares a first signal based on the enabled subset of the first analog devices and a second signal based on the enabled subset of the reference analog devices. In some embodiments, if a difference of the first and second signal is greater than a predetermined threshold, the memory controller 207 adds offset analog devices of the offset cell 214 until the difference is below the predetermined threshold. In some embodiments, a polarity of the difference of the first and second signal is a first polarity, and the memory controller 207 adds offset analog devices of the offset cell 214 until the polarity difference is a second polarity opposite of the first polarity.

In some embodiments, the memory controller 207 is an instance of the memory controller 105 in FIG. 1. In some embodiments, the memory cell array 202 is an instance of the memory cell array 120 in FIG. 1. In some embodiments, each memory cell 203 is an instance of the memory cell 125 in FIG. 1. In some embodiments, the reference array 204 is an instance of the reference memory array 140 in FIG. 1. In some embodiments, the binary search controller 212 is an instance of the binary search controller 130 in FIG. 1.

FIG. 2B is an example block diagram of a CNN 200B, in accordance with some embodiments. The CNN 200B is similar to the CNN 200A of FIG. 2A except that the CNN 200B includes the memory controller 207A. The memory controller 207A is similar to the memory controller 207 of FIG. 2A except that the memory controller 207A includes the current source circuitry 209A. The current source circuitry 209A is one embodiment of the charging circuitry 209 of FIG. 2A. The current source circuitry 209A includes current sources (CSs) 206A-206D. When enabled, CS 206A sources current to the enabled subset (e.g., portion) of the first capacitive elements of the memory cell array 202. When enabled, CS 206B sources current to the enabled subset of the second capacitive elements of the reference cell array 204. In some embodiments, the CSs 206A-B source an equal current, I1. When enabled, CS 206C sinks current from the enabled subset of the first capacitive elements. When enabled, CS 206D sinks current from the enabled subset of the second capacitive elements. In some embodiments, the CSs 206C-D an equal current, I2. In some embodiments, the CSs 206A-206D are programmable in that they can be programmed to provide different magnitudes of current. In some embodiments, the CSs 206A-206D are implemented using a reference current source/generator and current mirrors.

In some embodiments, the current source circuitry 209A includes switches 208A-208D. In some embodiments, the switches 208A-208D are selectively enabled to enable the CSs 206A-206D (e.g., provide a path for CSs 206A-206D to source/sink current), respectively. For example, if the switch 208A is enabled, CS 206A can source current to the enabled subset of the first capacitive elements, but if the switch 208A is disabled, the CS 206A is disconnected from the enabled subset of the first capacitive elements. In some embodiments, the switches 208A-208D are implemented as N-type Metal-oxide-semiconductor (NMOS) switches (e.g., transmission gates), P-type MOS (PMOS) switches, complementary MOS (CMOS) switches, etc. In some embodiments, the switches 208A-208B are implemented as PMOS switches and the switches 208C-208D are implemented as NMOS switches to, for example, reduce, for each switch, the resistance-capacitance (RC) time constant, which is a product of an on-resistance of the switch and an off-capacitance of the switch.

FIG. 2C is an example block diagram of a CNN 200C, in accordance with some embodiments. The CNN 200C is similar to the CNN 200A of FIG. 2A except that the CNN 200C includes the memory controller 207B. The memory controller 207B is similar to the memory controller 207 of FIG. 2A except that the memory controller 207B includes the charging circuitry 209B. The charging circuitry 209B is one embodiment of the charging circuitry 209 of FIG. 2A. The charging circuitry 209B includes resistive elements 226A-226B. The resistive element 226A (e.g., a first port of the resistive element 226A) is coupled to the memory cell array 202, via the node NM, and the resistive element 226B (e.g., a first port of the resistive element 226B) is coupled to the reference cell array 204, via the node NA. In some embodiments, when the resistive element 226A is in a first bias configuration (e.g., when a voltage potential (e.g., voltage drop, voltage difference, etc.) has a first polarity across the resistive element 226A), current flows (e.g., charge transfers) from the resistive element 226A and to the enabled subset (e.g., portion) of the first capacitive elements of the memory cell array 202. In some embodiments, when the resistive element 226B is in the first bias configuration, current flows (e.g., charge transfers) from the resistive element 226B and to the enabled subset (e.g., portion) of the second capacitive elements of the reference cell array 204. In some embodiments, when the resistive element 226A is in a second bias configuration, current flows (e.g., charge transfers) to the resistive element 226A and from the enabled subset (e.g., portion) of the first capacitive elements of the memory cell array 202. In some embodiments, when the resistive element 226B is in the second bias configuration, current flows (e.g., charge transfers) to the resistive element 226B and from the enabled subset (e.g., portion) of the second capacitive elements of the reference cell array 204.

In some embodiments, the charging circuitry 209B includes an inverter 228. The inverter 228 includes switches 230A-230B arranged in an inverter configuration (e.g., the gates of 230A-B are tied to an input (e.g., from the binary search controller 212), the source of 230A is tied to a low reference node (e.g., GND), the source of 230B is tied to a high reference node (e.g., VDD), and the drains of 230A-B are tied to an output coupled to the resistive elements 226A-B (e.g., a second port of the resistive element 226A-B)). In some embodiments, the switches 230A-B are selectively enabled to bias the resistive elements 226A-B. For example, if voltage ENB at an input of the inverter 228 is high (e.g., VDD), the switch 230A is enabled, and the switch 230B is disabled, coupling the resistive elements 226A-B to a high reference node (e.g., VDD) and biasing the resistive elements 226A-B in the first bias configuration. In some embodiments, if voltage ENB at an input of the inverter 228 is low (e.g., GND), the switch 230B is enabled, and the switch 230A is disabled, coupling the resistive elements 226A-B to a low reference node (e.g., GND) and biasing the resistive elements 226A-B in the second bias configuration. In some embodiments, the gates of the switches 230A-B are not tied together and have different inputs. In some embodiments, the different inputs can be controlled independently so that the resistive elements 226A-B are biased in a third bias configuration by simultaneously disabling both of the switches 230A-B. In the third bias configuration, the first capacitive elements in the memory cell array 202 and the second capacitive elements in the reference cell array 204 hold their respective charges. In some embodiments, the switch 230A is implemented as an NMOS switch, and the switch 230B is implemented as a PMOS switch.

FIG. 2D is an example block diagram of a CNN 200D, in accordance with some embodiments. The CNN 200D is similar to the CNN 200A of FIG. 2A except that the CNN 200D includes the memory controller 207C. The memory controller 207C is similar to the memory controller 207 of FIG. 2A except that the memory controller 207C includes the charging circuitry 209C. The charging circuitry 209C is one embodiment of the charging circuitry 209 of FIG. 2A. The charging circuitry 209C includes resistive elements 226A-226B. The operation of the resistive elements 226A-B is similar to the operation of the resistive elements 226A-B of FIG. 2C.

In some embodiments, the charging circuitry 209B includes switches 238A-238C. The switches 238A-C have their gates tied to an input (e.g., from the binary search controller 212). The source of 238A is coupled to a low reference node (e.g., GND). The drain of 238A is coupled to the NM node. The source of 238B is coupled to a low reference node (e.g., GND). The drain of 238B is coupled to the NA node. The source of 238C is coupled to a high reference node (e.g., VDD). The drain of 238C is coupled to the resistive elements 226A-226B. In some embodiments, the switches 238A-C are selectively enabled to bias the resistive elements 226A-B. For example, if voltage ENB at an input of the inverter 228 is high (e.g., VDD), the switches 238A-B are enabled, and the switch 238C is disabled, coupling the resistive elements 226A-B to a high reference node (e.g., VDD) and biasing the resistive elements 226A-B in the first bias configuration. In some embodiments, if voltage ENB at an input of the inverter 228 is low (e.g., GND), the switch 238C is enabled, and the switches 230A-B are disabled, coupling the resistive elements 226A-B to a low reference node (e.g., GND) and biasing the resistive elements 226A-B in the second bias configuration. In some embodiments, the gates of the switches 238A-C are not tied together and have different inputs. In some embodiments, the different inputs can be controlled independently so that the resistive elements 226A-B are biased in a third bias configuration by simultaneously disabling both of the switches 238A-C. In the third bias configuration, the first capacitive elements in the memory cell array 202 and the second capacitive elements in the reference cell array 204 hold their respective charges. In some embodiments, the switches 238A-B are implemented as an NMOS switch, and the switch 238C is implemented as a PMOS switch.

FIG. 2E is an example block diagram of a CNN 200E, in accordance with some embodiments. The CNN 200E is similar to the CNN 200A of FIG. 2A except that the CNN 200E includes the memory controller 207D. The memory controller 207D is similar to the memory controller 207 of FIG. 2A except that the memory controller 207D includes the load circuitry 209D. The load circuitry 209D is one embodiment of the charging circuitry 209 of FIG. 2A. The load circuitry 209D includes load elements 246A-246B. The load element 246A receives current from the enabled first subset of analog devices of the memory cell array 202 to generate a voltage V1 across the load element 246A. The load element 246B receives current from the enabled subset of reference analog devices of the reference cell array 204 to generate a voltage V2 across the load element 246B. In some embodiments, the load elements 246A-B are passive elements (e.g., resistive elements, capacitive elements).

In some embodiments, the load circuitry 209D includes voltage-dependent voltage sources (VDVS) 248A-248B. The VDVS 248A generates a voltage VM at node NM proportional (e.g., linearly proportional) to the voltage V1. The VDVS 248B generates a voltage VA at node NA proportional (e.g., linearly proportional) to the voltage V2.

Figure 4:
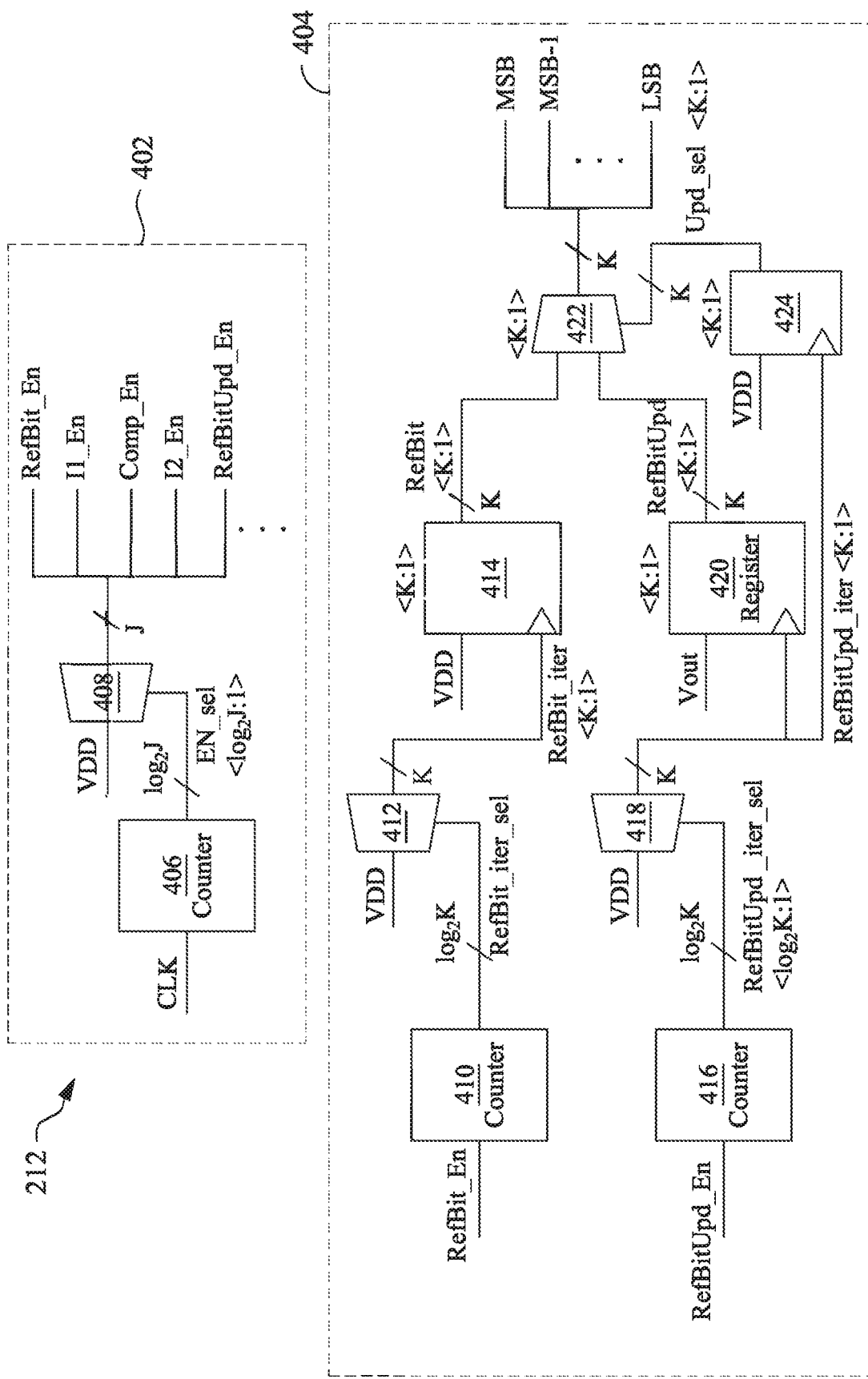
FIG. 4 is an example circuit diagram of a binary search controller, in accordance with some embodiments.

FIG. 4 is an example circuit diagram of a binary search controller 212, in accordance with some embodiments. The example circuit diagram of FIG. 4 shows an implementation for how the digital output that represents the enabled subset of the analog devices in the memory cell array 202 is stored (e.g., in register 420<K:1>). The example circuit diagram of FIG. 4 shows an implementation for how the control signals (e.g., the enables for the current sources 206A-D, I1_En and I2_En, the comparator 210 enable, Comp_En, the enables for the analog devices of the reference cell array 204, MSB-LSB) are generated. The example circuit diagram of FIG. 4 shows an implementation for how intermediary signals (e.g., RefBit_En, RefBitUpd_En) for determining the reference cell array 204 enables and the digital output are generated. In some embodiments, the binary search controller 212 includes circuitry 402 for generating enable signals (e.g., bits, pulses, voltages, periodic signals) to trigger a number of events (e.g., 7) of a single iteration of the operation 300 of FIG. 3. In some embodiments, one signal can trigger multiple events (e.g., a rise triggers a first event and a fall triggers a second event). In some embodiments, the circuitry 402 includes a counter 406 that receives a periodic clock signal (CLK) and generates a $\log_2$ J-wide word (EN_sel<$\log_2$ J:1>) indicating an event (e.g., time event, stage, etc.) count, where J is the number of events during a single iteration of the operation 300. In some embodiments, the counter resets after the number of events has been counted. In some embodiments, the circuitry 402 includes a demultiplexer (demux) 408 that selectively transfers a high voltage (e.g., VDD) at its signal input to one of its J outputs based on EN_sel<$\log_2$ J:1> received at its control/select input. In some embodiments, the outputs include Refbit_En (e.g., for $t_{1,1}$, $t_{2,1}$, etc.), I1_En (e.g., for $t_{1,2}$, $t_{1,3}$, $t_{2,2}$, $t_{2,3}$, etc.), Comp_En (e.g., for $t_{1,4}$, $t_{2,4}$, etc.), I2_En (e.g., for $t_{1,2}$, $t_{1,3}$, $t_{2,2}$, $t_{2,3}$, etc.), and RefBitUpd_En (e.g., for $t_{1,7}$, $t_{2,7}$, etc.).

In some embodiments, the binary search controller 212 includes circuitry 404 for determining the plurality of reference bits of the reference cell array 204. In some embodiments, the circuitry 404 includes a counter 410 that receives a periodic signal (RefBit_En) and generates a $\log_2$ K-wide word (RefBit_iter_sel<$\log_2$ K:1>) indicating a reference bit count, where K is the number of reference bits in the reference word. In some embodiments, the counter resets after the number of reference bits has been counted. In some embodiments, the circuitry 404 includes a demux 412 that selectively transfers a high voltage (e.g., VDD) at its signal input to one of its K outputs (RefBit_iter<K:1>) based on RefBit_iter_sel<$\log_2$ K:1> received at its control/select input. In some embodiments, the circuitry 404 includes K flip-flops 414 (e.g., edge triggered flip-flops, level triggered flip-flops, D flip-flops, SR flip-flops, latches). Each flip-flop 414 transfers a high voltage (e.g., VDD) from its respective input to its respective output (RefBit<i>, where 1<=i<=K) based on a trigger (e.g., triggering event, rising edge, rising edge with a slope greater than a predetermined threshold, level above a predetermined threshold) of RefBit_iter<i> at its respective clock input. For example, when Refbit_En goes high the first time, RefBit_iter_sel=1, RefBit_iter<1>=VDD, and RefBit<1>=VDD. In some embodiments, RefBit<1> is tied directly, or indirectly (via multiplexer 422<1> as described below) to MSB. Thus, in some embodiments, in the first iteration, MSB is set to VDD.

In some embodiments, the circuitry 404 includes a counter 416 that receives a periodic signal (RefBitUpd_En) and generates a $\log_2$ K-wide word (RefBitUpd_iter_sel<$\log_2$ K:1>) indicating a reference bit count. In some embodiments, the counter resets after the number of reference bits has been counted. In some embodiments, the circuitry 404 includes a demux 418 that selectively transfers a high voltage (e.g., VDD) at its signal input to one of its K outputs (RefBitUpd_iter<K:1>) based on RefBitUpd_iter_sel<$\log_2$ K:1> received at its control/select input. In some embodiments, the circuitry 404 includes K flip-flops 420. Each flip-flop 420 transfers Vout from its respective input to its respective output (RefBitUpd<i>), based on a trigger of RefBitUpd_iter<i> at its respective clock input. In some embodiments, the flip-flops 420 are implementations of the registers that store the plurality of reference bits that indicate the number of analog devices in the memory cell array 202.

In some embodiments, the circuitry 404 includes K multiplexers (muxes) 422. Each of the K muxes selects one of the RefBit<i> and the RefBitUpd<i> to transfer to its output based on a select bit (Upd_sel<i>) at its respective control input. The outputs of the K muxes 422 are each of the plurality of reference bits, respectively (e.g., MSB, MSB−1, LSB). In some embodiments, the circuitry 404 includes K flip-flops 424. Each of the flip-flops 424 selectively transfers a high voltage (e.g., VDD) at its respective input to the Upd_sel<i> at its respective output based on a triggering event of RefBitUpd_iter<i> at its respective clock input.

Figure 5B:
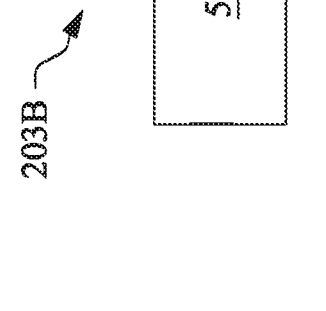
FIGS. 5A-5F are example circuit diagrams of different embodiments of a memory cell, in accordance with some embodiments.
Figure 5D:
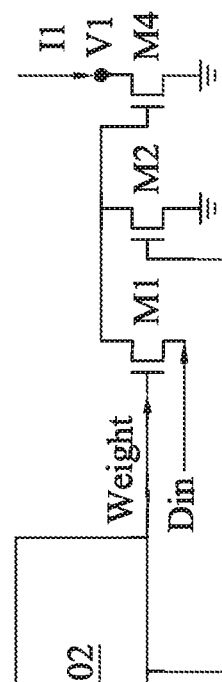
Figure 5A:
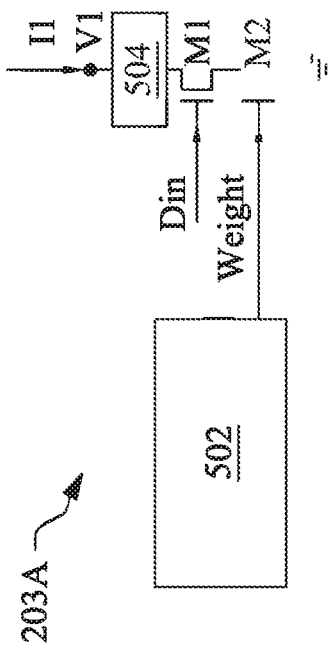

FIGS. 5A-5F are example circuit diagrams of different embodiments of the memory cell 203, in accordance with some embodiments. Each of the memory cells 203A-203F of FIGS. 5A-5F, respectively, are different embodiments of the memory cell 203. FIG. 5A is an example circuit diagram of a memory cell 203A. The memory cell 203A includes a memory cell core 502 that stores a weight bit. FIG. 6A is an example circuit diagram of the memory cell core 502. As shown in FIG. 6A, the memory cell core 502 includes cross-coupled inverters 602A-602B, a bit line (BL) at the output of the inverter 602A, a transmission gate 604A coupling the BL to a word line WL, a bit line bar (BLB) at the output of the inverter 602B, a transmission gate 604B coupling the BLB to a word line bar WLB. In some embodiments, a first voltage of the weight bit is stored on the BL. In some embodiments, a second voltage of the weight bit is stored on the BLB. In some embodiments, the second voltage is generated at the output of the inverter 602B in response to the first voltage being at the input of the inverter 602B. In some embodiments, the memory cell core 502 includes a six-transistor (6T) static random access memory (SRAM) cell (e.g., cell core), a two-transistor-two-resistor (2T-2R) SRAM cell, a four-transistor (4T)-SRAM cell, an eight-transistor (8T)-SRAM cell, a ten-transistor (10T)-SRAM cell, a dynamic random access memory (DRAM) cell, and other types of memory cells that are suitable for use within a memory array, some of which are enumerated in FIG. 9.

Figure 6A:
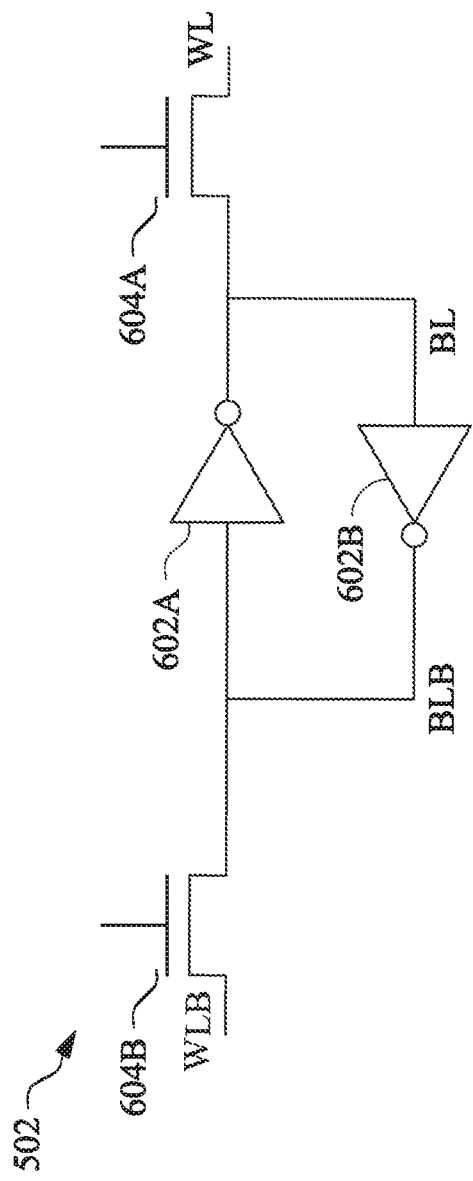
FIG. 6A is an example circuit diagram of memory cell core, in accordance with some embodiments.
Figure 6B:
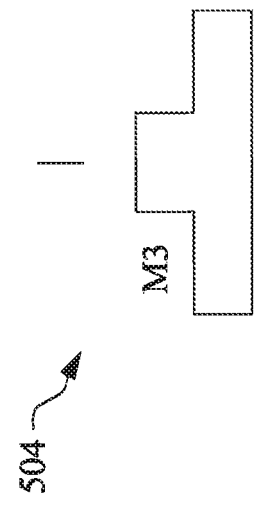
FIG. 6B is an example circuit diagram of a passive element, in accordance with some embodiments.

The memory cell 203A includes a device M1 including at least three terminals (an input and two outputs). M1 receives a Din bit at its input and selectively couples its two outputs based on a voltage level of the Din bit at its input exceeding a predetermined threshold. The memory cell 203A includes a device M2 including at least three terminals (an input and two outputs). M2 is coupled to the memory cell core 502 to receive the weight bit at its input and selectively couples its two outputs based on a voltage level of the weight bit at its input exceeding a predetermined threshold. One of the outputs of M2 is coupled to one of the outputs of M1 such that they are in a cascode structure. The other output of M2 is coupled to a reference node having an impedance less than a predetermined threshold (e.g., 1 ohm) such as GND. In some embodiments, M1 and M2 are MOS transistors in linear region, (e.g., NMOS or PMOS transistors) each MOS including a gate for an input and a drain and source for its outputs The memory cell 203A includes a passive element 504. A first terminal (port, end, side, plane, plate, etc.) of the passive element 504 is coupled to the other end of M1 and a second terminal of the passive element is coupled to a sensing node (e.g., a node coupled to the current source circuitry 209A of FIG. 2A, the node NM, etc.). M1 is on (e.g., enabled, impedance across M1's two outputs is less than a predetermined threshold such as 1 ohm) when it receives a high voltage (e.g., VDD) at its input. M2 is on when it receives a high voltage (e.g., VDD) at its input. When devices M1 and M2 are on, the passive element 504 is enabled (e.g., the passive element 504 is coupled to the reference node via M1 and M2 and the impedance between the passive element 504 and the reference node is less than a predetermined threshold such as 1 ohm). In some embodiments, when the passive element is enabled, FIG. 6B is an example circuit diagram of the passive element 504. As shown in FIG. 6B, the passive element 504 includes a MOS transistor capacitive element M3, wherein the gate forms one of the first and second terminals of M3 and the drain and source are coupled to form the other of the first and second terminals. In some embodiments, the passive element 504 includes a capacitive element such as a MOS capacitive element, a metal-on-metal (MOM) capacitive element, a metal-insulator-metal (MIM) capacitive element, or any two conductive plates separated by a distance; a resistive element; or an inductive element.

FIG. 5B is an example circuit diagram of a memory cell 203B. The memory cell 203B is similar to the memory cell 203A except that the cascode structure of M1 and M2 is coupling the sensing node to a first terminal of the passive element 504 and the second terminal of the passive element 504 is coupled to the reference node. The passive element 504 is enabled when, e.g., the impedance between the passive element 504 and the sensing node is less than a predetermined threshold such as 1 ohm.

Figure 5C:
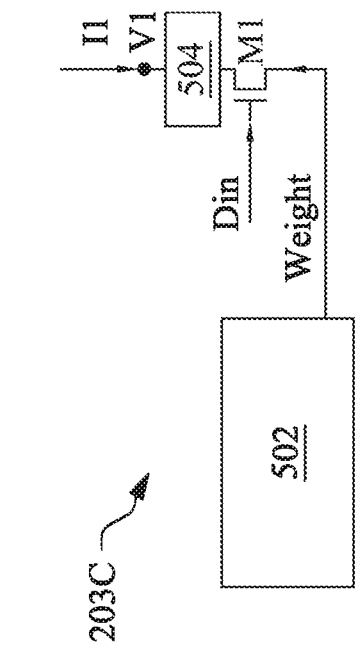

FIG. 5C is an example circuit diagram of a memory cell 203C. The memory cell 203C is similar to the memory cell 203A except that one of the outputs of M1 is coupled to the weight bit such that the weight bit is the reference node, and the other output of M1 is coupled to a first terminal of the passive element 504. In some embodiments, the passive element 504 is enabled when the weight bit is a low voltage (e.g., GND) and the Din bit is a high voltage (e.g., VDD).

FIG. 5D is an example circuit diagram of a memory cell 203D. The memory cell 203D includes the memory cell core 502. The weight bit stored in the memory cell 502 is coupled to an input of M1. The Din bit is coupled to a first output of M1. The second output of M1 is coupled to a transistor device biased in saturation M4. An inverse of the weight bit stored in the memory cell 502 is coupled to an input of M2. A reference node is coupled to a first output of M2. The second output of M2 is coupled to the input of M4. A first output of M4 is coupled to the reference node. A second output of M4 is coupled to a load (e.g., the load circuitry 209D of FIG. 2E, the load element 246A, etc.). In some embodiments, the passive element 504 is enabled when the weight bit is a high voltage (e.g., VDD) and the Din bit is a high voltage (e.g., VDD).

Figure 5E:
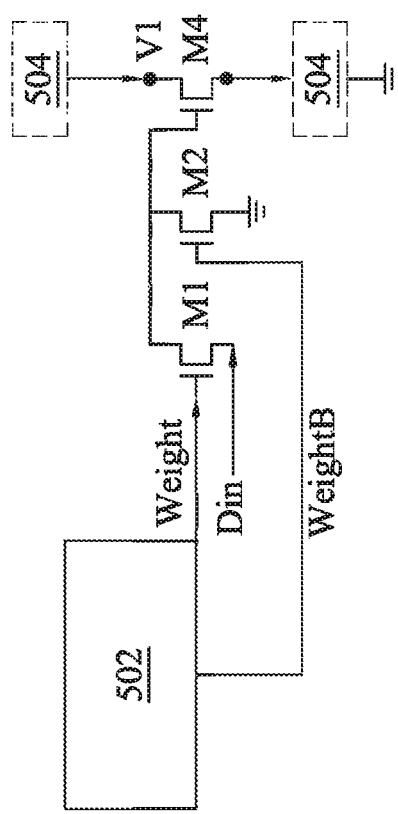

FIG. 5E is an example circuit diagram of a memory cell 203E. The memory cell 203E is similar to the memory cell 203D except that M4 is a transistor device biased in linear region (e.g., a switch including at least three terminals). In some embodiments, the memory cell 203E includes a passive element 504 that either couples a first output of M4 to a reference node (e.g., GND) or a second output of M4 to a sensing node (e.g., VM).

Figure 5F:
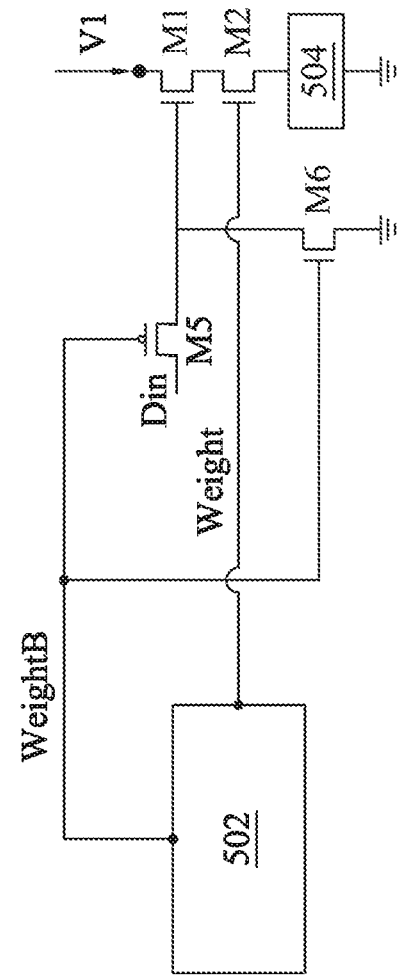

FIG. 5F is an example circuit diagram of a memory cell 203F. The memory cell 203F is similar to the memory cell 203B except that the memory cell 203F includes transistor devices M5 and M6 in linear region. The inverse of the weight bit is coupled to an input of M5, Din bit is coupled to a first output of M5, and the input of M1 is coupled to a second output of M5. The inverse of the weight bit is coupled to an input of M6. A reference node (e.g., GND) is coupled to a first output of M6, and the second output of M6 is coupled to the input of M1. In some embodiments, M1, M2, and M6 are NMOS transistors, and M5 is a PMOS transistor.

In some embodiments, the reference cells 205A-205K are implemented as one of the memory cells 203A-203F. In some embodiments, implementations of 205A-205K are similar to the memory cells 203A-203F except that they do not have a memory cell core 502. In some embodiments, implementations of 205A-205K are similar to the memory cells 203A-203F except that they receive a reference bit, a high voltage bit (e.g., VDD), and a low voltage bit (e.g., GND) instead of receiving a Din bit, a weight bit, and an inverse of the weight bit. In some embodiments, implementations of 205A-205K are similar to the memory cells 203A-203F except that include one less transistor device (e.g., they don't include M2), they receive a reference bit instead of receiving a Din bit, and they do not receive a weight bit or an inverse of the weight bit.

Figure 7:
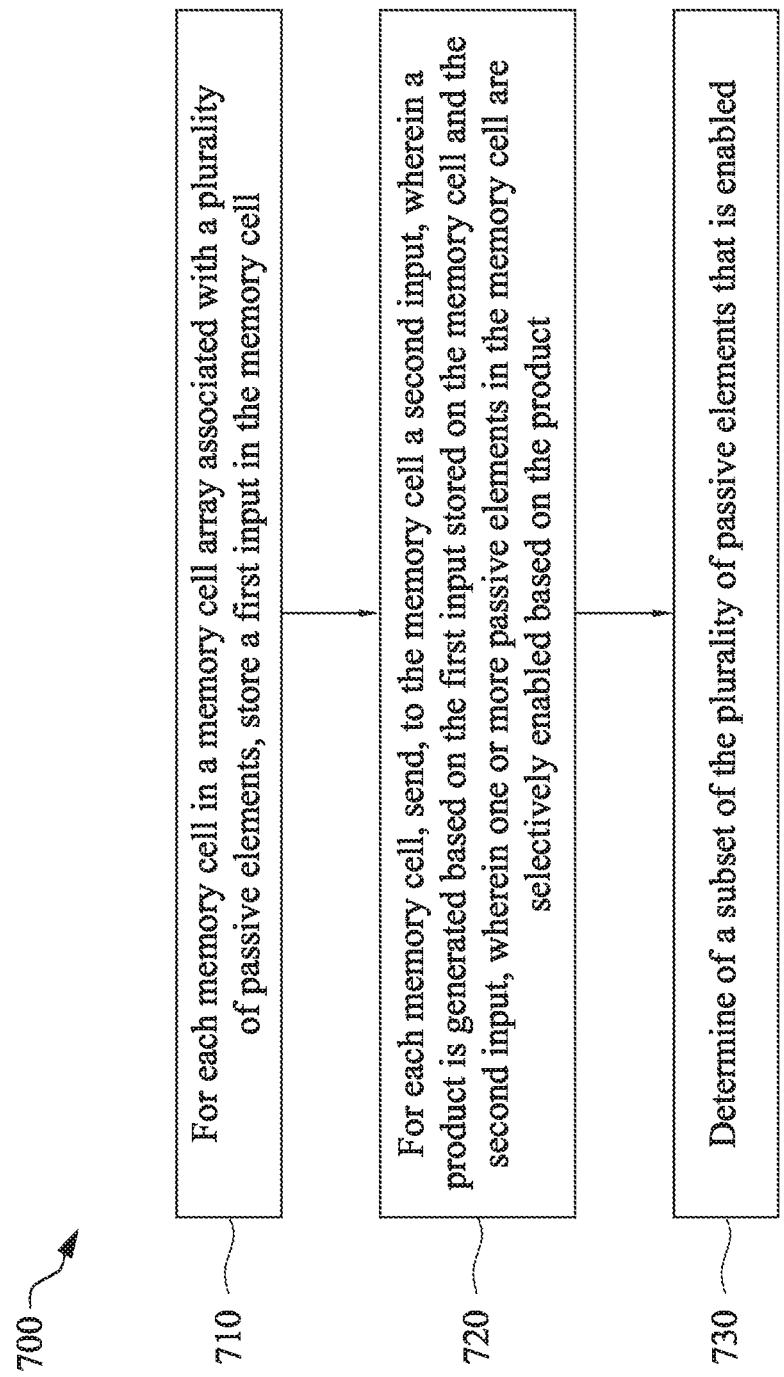
FIG. 7 is a flowchart of a method of multiplying, in accordance with some embodiments.

FIG. 7 is a flowchart of a method 700 of multiplying, in accordance with some embodiments. The method 700 may be performed by the memory controller 207 of FIG. 2A. In some embodiments, the operations of method 700 are performed in the order depicted in FIG. 7. In some embodiments, the operations of method 700 are performed simultaneously and/or in an order other than the order depicted in FIG. 7. In some embodiments, one or more operations are performed before, between, during, and/or after performing one or more operations of method 700.

At operation 710, for each memory cell 203 in a memory cell array 202 associated with a plurality of passive elements, the memory controller 207, stores a first input (weight) in the memory cell 203. In some embodiments, each memory cell 203 includes one or more passive elements of the plurality of passive elements. At operation 720, for each memory cell 203, the memory controller 207 sends, to the memory cell 203, a second input (Din). A product is generated based on the first input stored on the memory cell 203 and the second input. The one or more passive elements in the memory cell 203 are selectively enabled based on the product. For example, if the first input is a high voltage (e.g., VDD) and the second input is a high voltage (e.g., VDD), the one or more passive elements are enabled, and if either of the first input or the second input is a low voltage (e.g., GND), the one or more passive elements are disabled. At operation 730, the memory controller 207 determines a subset of the plurality of the plurality of passive elements that is enabled. In some embodiments, the memory controller 207 determines the subset by performing a binary search, as illustrated in FIG. 8.

Figure 8:
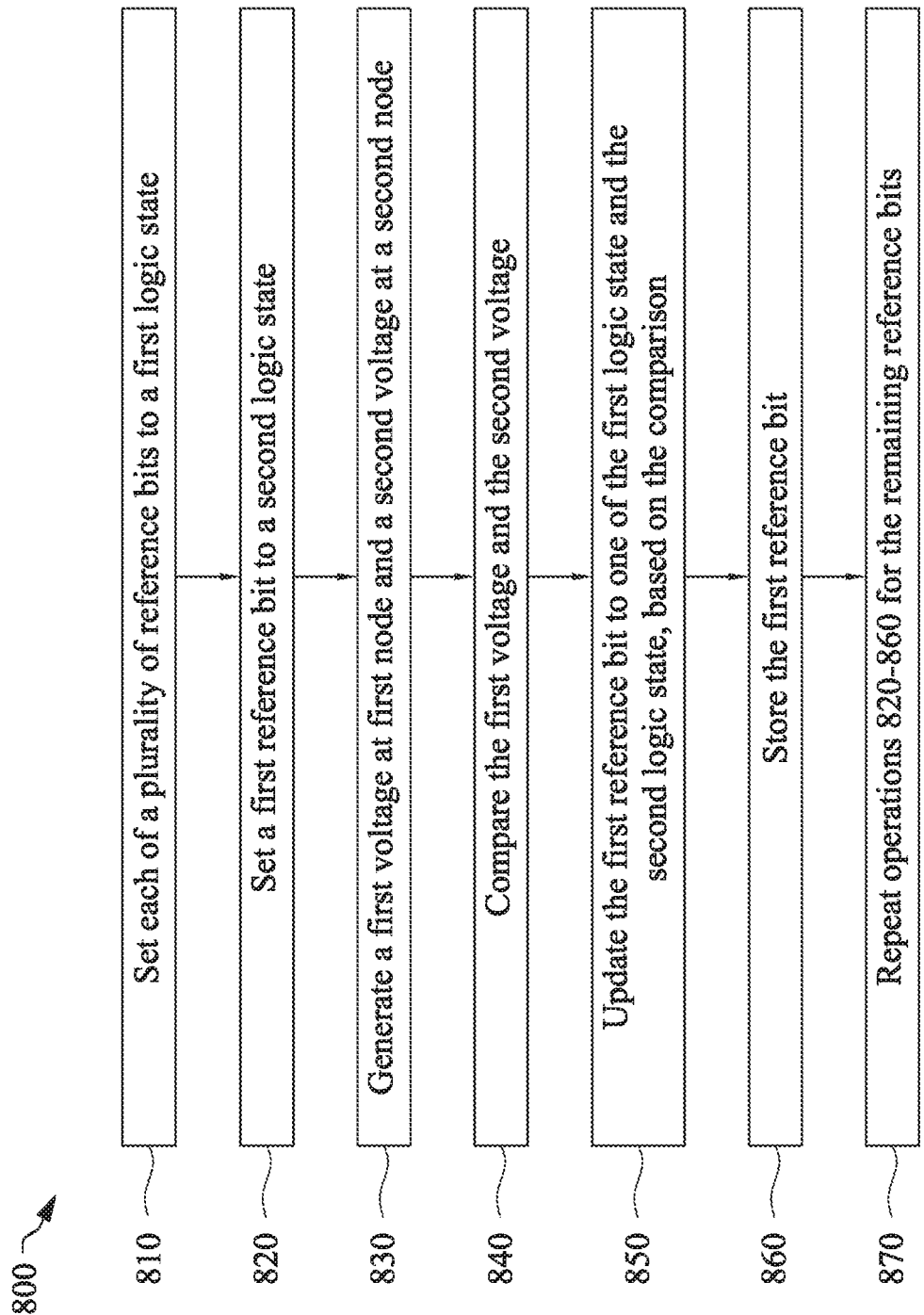
FIG. 8 is a flowchart of a method of performing a search, in accordance with some embodiments.

FIG. 8 is a flowchart of a method 800 of performing a search, in accordance with some embodiments. The method 800 may be performed by the memory controller 207 of FIG. 2A. In some embodiments, the operations of method 800 are performed in the order depicted in FIG. 8. In some embodiments, the operations of method 800 are performed simultaneously and/or in an order other than the order depicted in FIG. 8. In some embodiments, one or more operations are performed before, between, during, and/or after performing one or more operations of method 800. In some embodiments, one or more operations of the method 800 can be combined with one or more operations of the method 700.

At operation 810, the memory controller 207 sets each of a plurality of reference bits to a first logic state (e.g., low voltage, GND). In some embodiments, a plurality of reference analog devices of a reference cell array 204 is disabled responsive to setting each of the plurality of reference bits to a first logic state. At operation 820, the memory controller 207 sets a first reference bit, MSB, to a second logic state (e.g., high voltage, VDD). In some embodiments, the system operating the method 800 determines which bit is the first reference bit in accordance with the circuitry of FIG. 4. In some embodiments, a first subset of the plurality of reference analog devices is enabled responsive to setting the first reference bit to the second logic state.

At operation 830, the memory controller 207 generates a first voltage, VM, at a first node, NM, coupled to a plurality of first analog devices of a memory cell array 202 and a second voltage, VA, at a second node, NA, coupled to the plurality of reference analog devices. At operation 840, the memory controller 207 compares the first voltage to the second voltage. At operation 850, the memory controller 207 updates the first reference bit to one of the first logic state and the second logic state, based on the comparison. In some embodiments, being updated to the first logic state means that the memory controller 207 has determined that the one or more capacitive elements of the memory cell $203_{1,1}$ are disabled. In some embodiments, being updated to the first logic state means that the memory controller 207 has determined that the one or more capacitive elements of the memory cell $203_{1,1}$ are enabled. At operation 860, the memory controller 207 stores the first reference bit (e.g., the logic state of the first reference bit) (e.g., in a register).

At operation 870, the memory controller 207 repeats operations 820-860 for the remaining reference bits. This is because the method 800 is performing a binary search. Once the first comparison is made at operation 840, the memory controller 207 only has determined if the output digital word is <1000000 or >1000000 (assuming a 7-bit digital word corresponding to N=64 capacitors in the first memory cell $203_{1,1}$, N=32 in the second memory cell $203_{1,2}$, etc.). In some embodiments, after executing operation 870, an enabled subset of the plurality of reference analog devices is equivalent to an enabled subset of the plurality of the first analog devices and, in some embodiments, the plurality of reference bits that are stored indicate the enabled subset of the plurality of the first analog devices.

Figure 9:
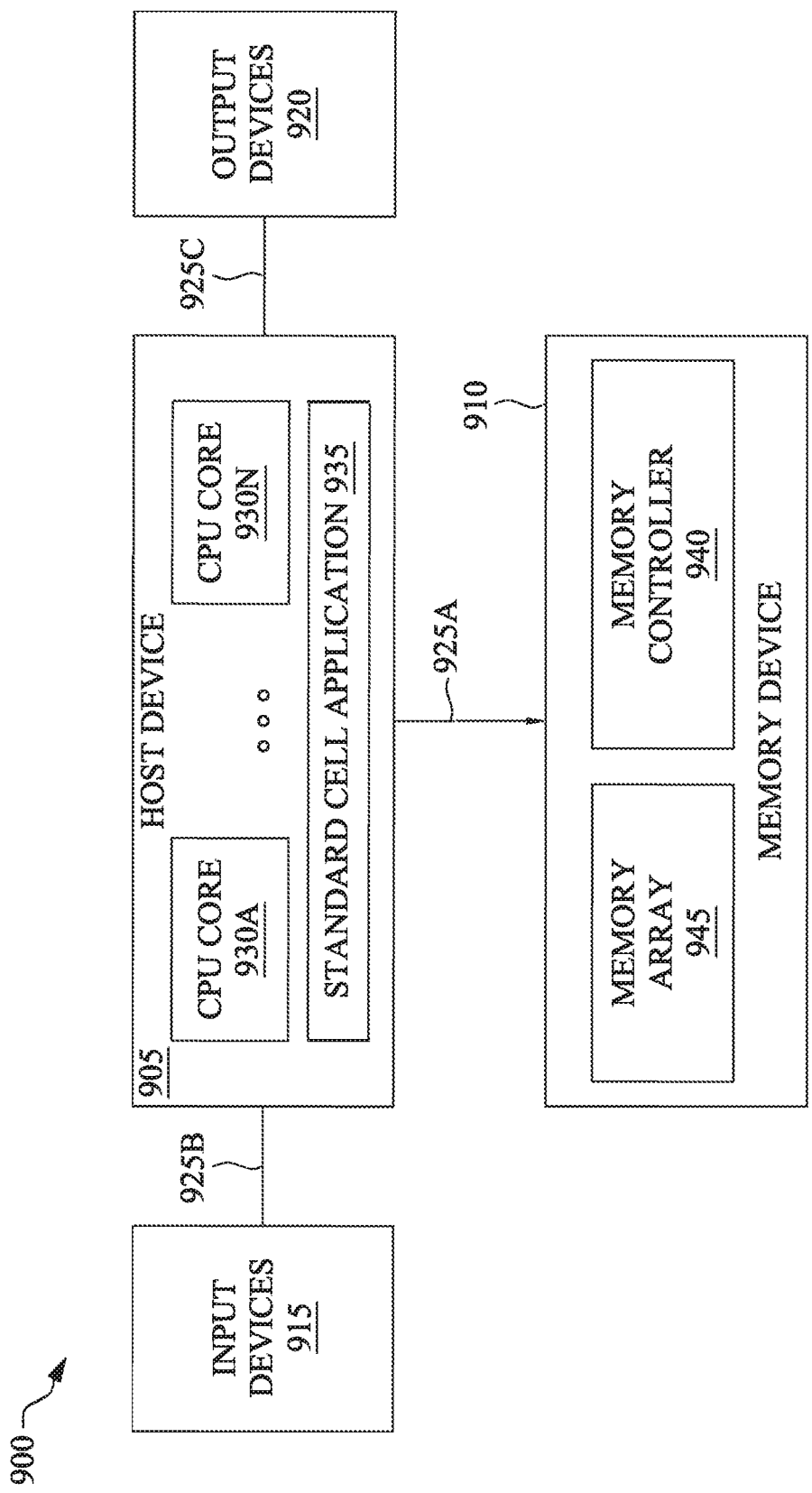
FIG. 9 is a computing system, in accordance with some embodiments.

Referring now to FIG. 9, an example block diagram of a computing system 900 is shown, in accordance with some embodiments of the disclosure. The computing system 900 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 900 includes a host device 905 associated with a memory device 910. The host device 905 may be configured to receive input from one or more input devices 915 and provide output to one or more output devices 920. The host device 905 may be configured to communicate with the memory device 910, the input devices 915, and the output devices 920 via appropriate interfaces 925A, 925B, and 925C, respectively. The computing system 900 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 905.

The input devices 915 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 905 and that allows an external source, such as a user (e.g., a circuit or layout designer), to enter information (e.g., data) into the host device and send instructions to the host device. Similarly, the output devices 920 may include a variety of output technologies such as external memories, printers, speakers, displays, microphones, light emitting diodes, headphones, video devices, and any other output peripherals that are configured to receive information (e.g., data) from the host device 905. The "data" that is either input into the host device 905 and/or output from the host device may include any of a variety of textual data, circuit data, signal data, semiconductor device data, graphical data, combinations thereof, or other types of analog and/or digital data that is suitable for processing using the computing system 900.

The host device 905 includes or is associated with one or more processing units/processors, such as Central Processing Unit ("CPU") cores 930A-930N. The CPU cores 930A-930N may be implemented as an Application Specific Integrated Circuit ("ASIC"), Field Programmable Gate Array ("FPGA"), or any other type of processing unit. Each of the CPU cores 930A-930N may be configured to execute instructions for running one or more applications of the host device 905. In some embodiments, the instructions and data to run the one or more applications may be stored within the memory device 910. The host device 905 may also be configured to store the results of running the one or more applications within the memory device 910. Thus, the host device 905 may be configured to request the memory device 910 to perform a variety of operations. For example, the host device 905 may request the memory device 910 to read data, write data, update or delete data, and/or perform management or other operations. One such application that the host device 905 may be configured to run may be a standard cell application 935. The standard cell application 935 may be part of a computer aided design or electronic design automation software suite that may be used by a user of the host device 905 to use, create, or modify a standard cell of a circuit. In some embodiments, the instructions to execute or run the standard cell application 935 may be stored within the memory device 910. The standard cell application 935 may be executed by one or more of the CPU cores 930A-930N using the instructions associated with the standard cell application from the memory device 910. In one example, the standard cell application 935 allows a user to utilize pre-generated schematic and/or layout designs of the memory device 100 or a portion of the memory device 100 to aid integrated circuit design. After the layout design of the integrated circuit is complete, multiples of the integrated circuit, for example, including the memory device 100 or a portion of the memory device 100 can be fabricated according to the layout design by a fabrication facility.

Referring still to FIG. 9, the memory device 910 includes a memory controller 940 that is configured to read data from or write data to a memory array 945. The memory array 945 may include a variety of volatile and/or non-volatile memories. For example, in some embodiments, the memory array 945 may include NAND flash memory cores. In other embodiments, the memory array 945 may include NOR flash memory cores, SRAM cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 945 may be individually and independently controlled by the memory controller 940. In other words, the memory controller 940 may be configured to communicate with each memory within the memory array 945 individually and independently. By communicating with the memory array 945, the memory controller 940 may be configured to read data from or write data to the memory array in response to instructions received from the host device 905. Although shown as being part of the memory device 910, in some embodiments, the memory controller 940 may be part of the host device 905 or part of another component of the computing system 900 and associated with the memory device. The memory controller 940 may be implemented as a logic circuit in either software, hardware, firmware, or combination thereof to perform the functions described herein. For example, in some embodiments, the memory controller 940 may be configured to retrieve the instructions associated with the standard cell application 935 stored in the memory array 945 of the memory device 910 upon receiving a request from the host device 905.

It is to be understood that only some components of the computing system 900 are shown and described in FIG. 9. However, the computing system 900 may include other components such as various batteries and power sources, networking interfaces, routers, switches, external memory systems, controllers, etc. Generally speaking, the computing system 900 may include any of a variety of hardware, software, and/or firmware components that are needed or considered desirable in performing the functions described herein. Similarly, the host device 905, the input devices 915, the output devices 920, and the memory device 910 including the memory controller 940 and the memory array 945 may include other hardware, software, and/or firmware components that are considered necessary or desirable in performing the functions described herein.

One aspect of this description relates to a convolutional neural network (CNN). The CNN includes a memory cell array including a plurality of memory cells. Each memory cell includes at least one first capacitive element of a plurality of first capacitive elements. Each memory cell is configured to multiply a weight bit and an input bit. The at least one first capacitive element is enabled when each of a first voltage of the weight bit and a second voltage of the input bit satisfies a predetermined threshold. The CNN includes a reference cell array comprising a plurality of second capacitive elements. The CNN includes a memory controller configured to compare a first signal associated with the plurality of first capacitive elements with a second signal associated with at least one second capacitive element of the plurality of second capacitive elements, and based on the comparison, determine whether the at least one first capacitive element is enabled.

In some embodiments, the plurality of memory cells is located at an intersection of a plurality of input lines defining rows and a plurality of weight lines defining columns. In some embodiments, a weight word, including a plurality of weight bits, is stored, via the plurality of weight lines, on the plurality of memory cells, such that each weight bit is stored in a different column of memory cells. In some embodiments, an input word, including input bits, is asserted, via the plurality of input lines, on the plurality of memory cells, such that each input bit is asserted on a different row of memory cells.

In some embodiments, the at least one first capacitive element has a quantity that is proportional to a weight bit position of the weight bit the at least one first capacitive element is associated with.

In some embodiments, the memory controller is configured to store a plurality of reference bits indicating the enabled subset of the plurality of first capacitive elements.

In some embodiments, the memory cell array includes a first transistor and a second transistor in a cascode configuration. In some embodiments, the weight bit is coupled to an input of the first transistor. In some embodiments, the input bit is coupled to an input of the second transistor. In some embodiments, a first output of the first transistor is coupled to the at least one first capacitive element. In some embodiments, a first output of the second transistor is coupled to a reference node.

In some embodiments, the memory controller includes a current source to charge the at least one capacitive element for a predetermined amount of time.

In some embodiments, the memory controller includes a comparator to compare the first signal to the second signal.

In some embodiments, the CNN further includes an offset cell to compensate for mismatch of a first property of the plurality of first capacitive elements and a second property of the plurality of second capacitive elements.

One aspect of this description relates to a method by a memory controller. The method includes proceeding, starting with each of a plurality of reference bits in a first logic state such that a plurality of reference analog devices of a reference cell array is disabled, to search for an enabled subset of a plurality of first analog devices in a memory cell array. Proceeding to search for the enabled subset of the first analog devices includes setting a first reference bit to a second logic state, thereby enabling a first subset of the plurality of reference analog devices, generating a first voltage at a first node coupled to the plurality of first analog devices and a second voltage at a second node coupled to the plurality of reference analog devices, comparing the first voltage and the second voltage, updating the first reference bit to one of the first logic state and the second logic state, based on the comparison, and storing the first reference bit. Proceeding to search for the enabled subset of the first analog devices includes proceeding, with the updated plurality of reference bits acting as an initial value for a next iteration, until the plurality of reference bits indicates the enabled subset of first analog devices.

In some embodiments, updating the first reference bit to the first logic state causes the first enabled subset of reference analog devices to be disabled.

In some embodiments, the plurality of first analog devices includes a plurality of first capacitive elements and the plurality of reference analog devices include a plurality of second capacitive elements.

In some embodiments, the proceeding to search for the enabled subset of first analog devices includes sourcing, for a first predetermined time period, a first current to the first node to charge an enabled subset of the plurality of first capacitive elements and a second current to the second node to charge an enabled subset of the plurality of reference capacitive elements, and sinking, for a second predetermined time period, a third current from the first node to discharge the enabled subset of first capacitive elements and a fourth current from the second node to discharge the enabled subset of reference capacitive elements.

In some embodiments, the plurality of first analog devices includes a plurality of first transistors in saturation and the plurality of reference analog devices include a plurality of second transistors in saturation.

In some embodiments, the enabled subset of first analog devices sources a first current to the first node and an enabled subset of reference analog devices sources a second current to the second node.

In some embodiments, sourcing the first current through a first passive load coupling the first node and a reference node generates the first voltage, and sourcing the second current through a second passive load coupling the second node and the reference node generates the second voltage.

One aspect of this description relates to a memory cell. The memory cell includes a cell core configured to store a weight bit, one or more analog device, and one or more switches configured to selectively couple, based on the weight bit and a digital input bit, the one or more analog devices to one of a sensing node or a reference node.

In some embodiments, the one or more switches are in a cascode structure.

In some embodiments, the one or more switches are configured to couple the one or more analog devices to one of the sensing node or the reference node responsive to the weight bit having a first voltage level greater than a predetermined threshold and the digital input bit having a second voltage level greater than the predetermined threshold.

In some embodiments, a quantity of the one or more analog devices is proportional to a weight bit position of the weight bit.

In some embodiments, the cell core is a six-transistor (6T) static random access memory (SRAM) cell and the one or more analog devices are one or more capacitive elements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A convolutional neural network (CNN) comprises:
a memory cell array including a plurality of memory cells, wherein each memory cell comprises at least one first capacitive element of a plurality of first capacitive elements, wherein each memory cell is configured to multiply a weight bit and an input bit, and wherein the at least one first capacitive element is enabled when each of a first voltage of the weight bit and a second voltage of the input bit satisfies a predetermined threshold;
a reference cell array comprising a plurality of second capacitive elements; and
a memory controller configured to:
compare a first signal associated with the plurality of first capacitive elements with a second signal associated with at least one second capacitive element of the plurality of second capacitive elements; and
based on the comparison, determine whether the at least one first capacitive element is enabled.

2. The CNN of claim 1, wherein the plurality of memory cells is located at an intersection of a plurality of input lines defining rows and a plurality of weight lines defining columns, wherein a weight word, comprising a plurality of weight bits, is stored, via the plurality of weight lines, on the plurality of memory cells, such that each weight bit is stored in a different column of memory cells, and wherein an input word, comprising input bits, is asserted, via the plurality of input lines, on the plurality of memory cells, such that each input bit is asserted on a different row of memory cells.

3. The CNN of claim 1, wherein the at least one first capacitive element has a quantity that is proportional to a weight bit position of the weight bit the at least one first capacitive element is associated with.

4. The CNN of claim 1, wherein the memory controller is configured to store a plurality of reference bits indicating the enabled subset of the plurality of first capacitive elements.

5. The CNN of claim 1, wherein the memory cell array comprises a first transistor and a second transistor in a cascade configuration, wherein the weight bit is coupled to an input of the first transistor, wherein the input bit is coupled to an input of the second transistor, wherein a first output of the first transistor is coupled to the at least one first capacitive element and wherein a first output of the second transistor is coupled to a reference node.

6. The CNN of claim 1, wherein the memory controller comprises a current source to charge the at least one capacitive element for a predetermined amount of time.

7. The CNN of claim 1, wherein the memory controller comprises a comparator to compare the first signal to the second signal.

8. The CNN of claim 1, further comprising an offset cell to compensate for mismatch of a first property of the plurality of first capacitive elements and a second property of the plurality of second capacitive elements.

9. A method, by a memory controller, comprising:
proceeding, starting with each of a plurality of reference bits in a first logic state such that a plurality of reference analog devices of a reference cell array is disabled, to search for an enabled subset of a plurality of first analog devices in a memory cell array, including:
setting a first reference bit to a second logic state, thereby enabling a first subset of the plurality of reference analog devices;
generating a first voltage at a first node coupled to the plurality of first analog devices and a second voltage at a second node coupled to the plurality of reference analog devices;
comparing the first voltage and the second voltage;
updating the first reference bit to one of the first logic state and the second logic state, based on the comparison; and
storing the first reference bit,
with the updated plurality of reference bits acting as an initial value for a next iteration, until the plurality of reference bits indicates the enabled subset of first analog devices.

10. The method of claim 9, wherein updating the first reference bit to the first logic state causes the first enabled subset of reference analog devices to be disabled.

11. The method of claim 9, wherein the plurality of first analog devices includes a plurality of first capacitive elements and the plurality of reference analog devices includes a plurality of second capacitive elements.

12. The method of claim 11, wherein the proceeding to search for the enabled subset of first analog devices comprises:
sourcing, for a first predetermined time period, a first current to the first node to charge an enabled subset of the plurality of first capacitive elements and a second current to the second node to charge an enabled subset of the plurality of reference capacitive elements; and
sinking, for a second predetermined time period, a third current from the first node to discharge the enabled subset of first capacitive elements and a fourth current from the second node to discharge the enabled subset of reference capacitive elements.

13. The method of claim 9, wherein the plurality of first analog devices includes a plurality of first transistors in saturation and the plurality of reference analog devices includes a plurality of second transistors in saturation.

14. The method of claim 13, wherein the enabled subset of first analog devices sources a first current to the first node and an enabled subset of reference analog devices sources a second current to the second node.

15. The method of claim 14, wherein sourcing the first current through a first passive load coupling the first node and a reference node generates the first voltage, and wherein sourcing the second current through a second passive load coupling the second node and the reference node generates the second voltage.

16. A memory cell comprising:
a cell core configured to store a weight bit;
one or more analog devices; and
one or more switches configured to selectively couple, based on the weight bit and a digital input bit, the one or more analog devices to one of a sensing node or a reference node, wherein a quantity of the one or more analog devices is proportional to a weight bit position of the weight bit.

17. The memory cell of claim 16, wherein the one or more switches are in a cascade structure.

18. The memory cell of claim 16, wherein the one or more switches are configured to couple the one or more analog devices to one of the sensing node or the reference node responsive to the weight bit having a first voltage level greater than a predetermined threshold and the digital input bit having a second voltage level greater than the predetermined threshold.

19. The memory cell of claim 16, wherein a quantity of the one or more analog devices is proportional to a weight bit position of the weight bit.

20. The memory cell of claim 16, wherein the cell core is a six-transistor (6T) static random access memory (SRAM) cell and the one or more analog devices are one or more capacitive elements.

* * * * *